United States Patent
Hwang et al.

(10) Patent No.: US 10,115,640 B2
(45) Date of Patent: Oct. 30, 2018

(54) METHOD OF MANUFACTURING INTEGRATED CIRCUIT DEVICE

(71) Applicant: Samsung Electronics Co., Ltd., Suwon-si (KR)

(72) Inventors: Hee-don Hwang, Seoul (KR); Young-wook Park, Osan-si (KR); Min-woo Kim, Gimhae-si (KR); Yoo-jin Jeong, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/460,273

(22) Filed: Mar. 16, 2017

(65) Prior Publication Data
US 2018/0025947 A1    Jan. 25, 2018

(30) Foreign Application Priority Data
Jul. 21, 2016  (KR) .......................... 10-2016-0092900

(51) Int. Cl.
*H01L 21/76*    (2006.01)
*H01L 21/8234*  (2006.01)
*H01L 21/308*   (2006.01)

(52) U.S. Cl.
CPC .. *H01L 21/823481* (2013.01); *H01L 21/3086* (2013.01); *H01L 21/823431* (2013.01); *H01L 21/823475* (2013.01)

(58) Field of Classification Search
CPC ......... H01L 21/823481; H01L 21/3086; H01L 21/823475; H01L 21/823431
See application file for complete search history.

(56) References Cited

U.S. PATENT DOCUMENTS

| | | | |
|---|---|---|---|
| 7,767,565 B2 | 8/2010 | Chung | |
| 7,816,228 B2* | 10/2010 | Kim | H01L 21/3081 257/E21.546 |
| 8,017,491 B2 | 9/2011 | Lee et al. | |
| 8,288,263 B2 | 10/2012 | Kim et al. | |
| 8,766,355 B2 | 7/2014 | Lee et al. | |
| 9,093,500 B2 | 7/2015 | Park et al. | |
| 9,240,458 B2 | 1/2016 | Na et al. | |
| 2011/0269304 A1* | 11/2011 | Kim | H01L 21/02057 438/591 |
| 2012/0225554 A1 | 9/2012 | Yoon et al. | |

\* cited by examiner

*Primary Examiner* — Ismail Muse
(74) *Attorney, Agent, or Firm* — Muir Patent Law, PLLC

(57) ABSTRACT

A method of manufacturing an integrated circuit device includes providing a substrate with a pattern structure, the pattern structure including a plurality of first patterns that extend in a first direction, are parallel to one another, and are separated from one another with a space therebetween. At least one support structure that contacts an upper surface of the pattern structure and extends on the pattern structure in a second direction that crosses the first direction is formed. A buried layer that fills the spaces between the plurality of first patterns while the at least one support structure contacts the upper surface of the pattern structure is formed. The at least one support structure is separated from the pattern structure.

20 Claims, 56 Drawing Sheets

METHOD OF MANUFACTURING INTEGRATED CIRCUIT DEVICE

CROSS-REFERENCE TO RELATED APPLICATION

This application claims the benefit of priority under 35 USC § 119 to Korean Patent Application No. 10-2016-0092900, filed on Jul. 21, 2016, in the Korean Intellectual Property Office, the disclosure of which is incorporated herein in its entirety by reference.

BACKGROUND

The present disclosure relates to a method of manufacturing an integrated circuit (IC) device, and more particularly, to a method of manufacturing an IC device using a plurality of patterns.

With the development of electronic technology, semiconductor devices have been recently rapidly down-scaled. In the manufacturing of a highly integrated semiconductor device, a pattern formation process may become more difficult due to the micronization of a pattern size. For example, a line-and-space pattern with a repeated arrangement of a plurality of patterns may be more prone to warpage or collapse when a width of patterns is reduced and a space depth between patterns is increased.

SUMMARY

The embodiments of the inventive concept provide a method of manufacturing an integrated circuit (IC) device capable of preventing pattern warpage or collapse, inhibiting pattern failure, and consequentially improving manufacturing yield and ensuring the manufacture of an IC device with improved reliability.

According to an aspect of the inventive concept, there is provided a method of manufacturing an integrated circuit device, the method including providing a substrate with a pattern structure, the pattern structure comprising a plurality of first patterns that extend in a first direction, are parallel to one another, and are separated from one another with a space therebetween; forming at least one support structure that contacts an upper surface of the pattern structure and extends on the pattern structure in a second direction that crosses the first direction; forming, while the at least one support structure contacts the upper surface of the pattern structure, a buried layer that fills the spaces between the plurality of first patterns; and removing the at least one support structure from the pattern structure.

According to another aspect of the inventive concept, there is provided a method of manufacturing an integrated circuit device, the method including forming a device isolation trench in a substrate, the device isolation trench defining a plurality of active regions. A device isolation layer that fills the device isolation trench around the plurality of active regions is formed. A plurality of mask line patterns are on the plurality of active regions and the device isolation layer, the plurality of mask line patterns extending parallel to one another in a first direction and being separated from one another by a predefined distance. A plurality of space lines and a plurality of line patterns that define the plurality of space lines are formed by etching the plurality of active regions and the device isolation layer with the plurality of mask line patterns as an etch mask. At least one support structure that contacts an upper surface of the plurality of mask line patterns and extends on the plurality of mask line patterns in a second direction that intersects the first direction are formed. A word line structure that fills the plurality of space lines while the at least one support structure contacts the upper surface of the plurality of mask line patterns is formed.

According to another aspect of the inventive concept, there is provided a method of manufacturing an integrated circuit device, the method including forming a device isolation trench that defines a plurality of active regions extending parallel to one another in a first direction, by etching a substrate; forming at least one support structure that contacts an upper surface of the plurality of active regions and extends on the plurality of active regions in a second direction that intersects the first direction; forming a device isolation layer that fills the device isolation trench while the at least one support structure contacts the upper surface of the plurality of active regions; and removing the at least one support structure from the plurality of active regions.

According to another aspect of the inventive concept, there is provided a method of manufacturing an integrated circuit device, the method including providing a substrate with a pattern structure, the pattern structure comprising a plurality of first patterns that extend in a first direction, are parallel to one another, and are separated from one another with a space therebetween; forming a sacrificial pattern on the substrate, the sacrificial pattern filling the spaces between the plurality of first patterns and formed of a different material from a material of the pattern structure; forming at least one support structure on upper surfaces of the pattern structure and extending on the pattern structure and the sacrificial pattern in a second direction that crosses the first direction, wherein the at least one support structure is formed of a different material from a material of the sacrificial pattern; removing the sacrificial pattern from the spaces in the plurality first patterns; forming, while the at least one support structure contacts the upper surface of the pattern structure, a buried layer that fills the spaces between the plurality of first patterns; and removing the at least one support structure from the pattern structure so that only the buried layer remains in the spaces between the plurality of first patterns.

BRIEF DESCRIPTION OF THE DRAWINGS

Embodiments of the inventive concept will be more clearly understood from the following detailed description taken in conjunction with the accompanying drawings in which:

FIGS. 2A to 7B are schematic views for describing a method of manufacturing an IC device according to exemplary embodiments of the inventive concept, and in particular, FIGS. 2A, 3A, 4A, 5A, 6A, and 7A are perspective views of essential parts for describing sequential processes of manufacturing an IC device according to exemplary embodiments of the inventive concept, and FIGS. 2B, 3B, 4B, 5B, 6B, and 7B are cross-sectional views taken along lines B-B' of FIGS. 2A, 3A, 4A, 5A, 6A, and 7A, respectively;

FIGS. 8A to 10B are schematic views for describing a method of manufacturing an IC device according to exemplary embodiments of the inventive concept, and in particular, FIGS. 8A, 9A, and 10A are perspective views of essential parts for describing sequential processes of manufacturing an IC device according to exemplary embodiments of the inventive concept, and FIGS. 8B, 9B, and 10B are cross-sectional views taken along lines B-B' of FIGS. 8A, 9A, and 10A, respectively;

FIGS. 11A to 20 are schematic views for describing a method of manufacturing an IC device according to exemplary embodiments of the inventive concept, and in particular, FIGS. 11A, 12A, 13A, 14A, 15A, and 16A are plan views for describing sequential processes of manufacturing an IC device according to exemplary embodiments of the inventive concept, FIGS. 17, 18A, 19, and 20 are cross-sectional views illustrating sequential processes after the processes illustrated in FIGS. 16A and 16B.

FIGS. 22A to 28 are schematic views for describing a method of manufacturing an IC device according to exemplary embodiments of the inventive concept, and in particular, FIGS. 22A, 23A, 24A, and 25A are plan views for describing sequential processes of manufacturing an IC device according to exemplary embodiments of the inventive concept, FIGS. 26 to 28 are cross-sectional views illustrating sequential processes after the processes illustrated in FIGS. 25A and 25B.

DETAILED DESCRIPTION OF THE EMBODIMENTS

Figure 1:
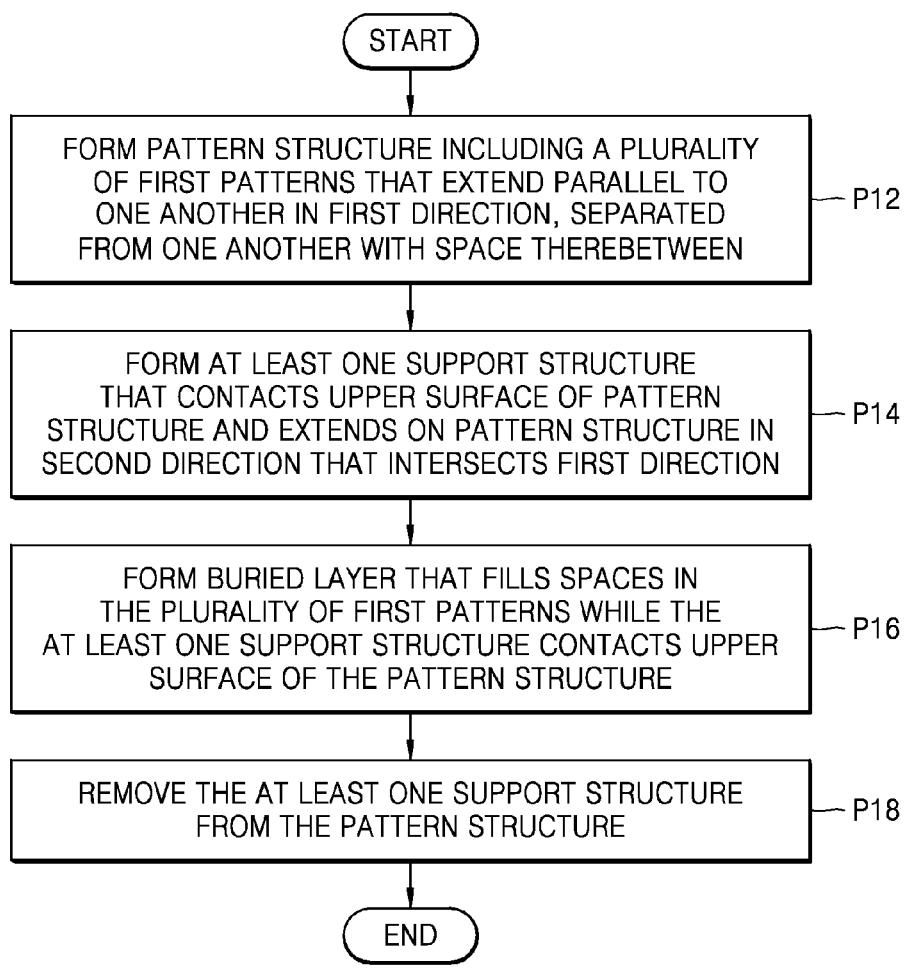
FIG. 1 is a flowchart of a method of manufacturing an integrated circuit (IC) device according to exemplary embodiments of the inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the term "substrate" may refer to the initial substrate itself (e.g., a bulk silicon, silicon-germanium, etc., wafer cut from an ingot), or an intermediate monolithic structure formed from the initial substrate, such as a stack structure including the initial substrate and layers or films on deposited on the surface of the initial substrate. As used herein, the term "surface of a substrate" may refer to an exposed surface of an initial substrate itself or a surface of a layer or film on the later formed substrate.

Unless otherwise defined, all terms (including technical and scientific terms) used herein have the same meaning as commonly understood by one of ordinary skill in the art to which this disclosure belongs.

FIG. 1 is a flowchart of a method of manufacturing an integrated circuit (IC) device according to exemplary embodiments of the inventive concept.

Figure 2A:
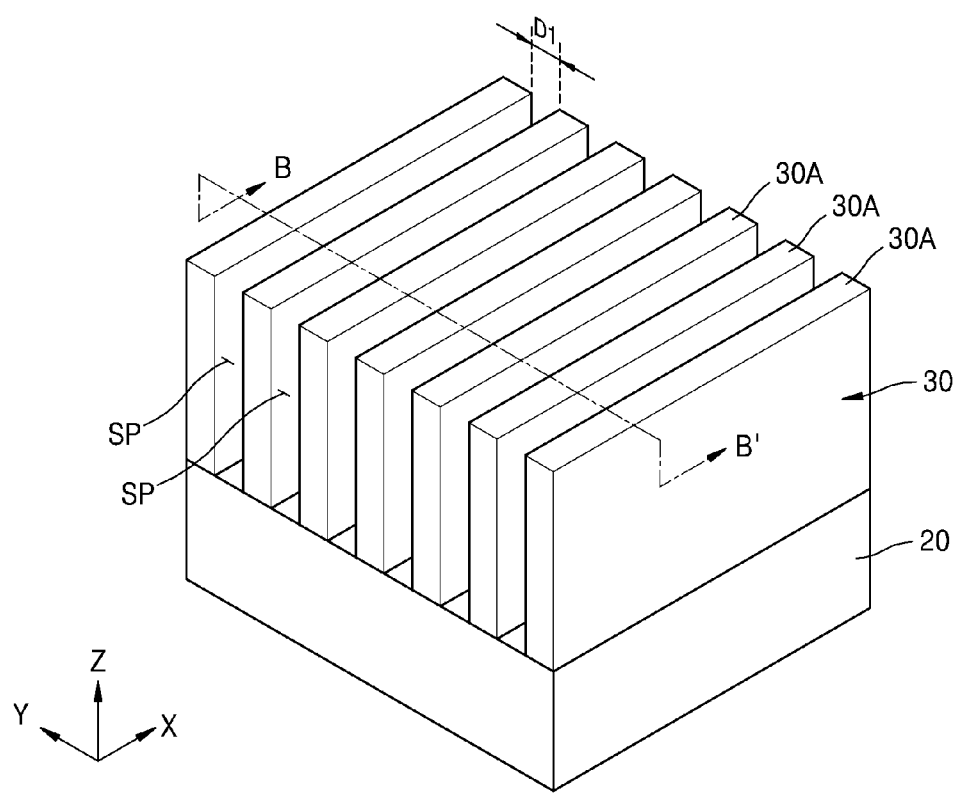
Figure 2B:
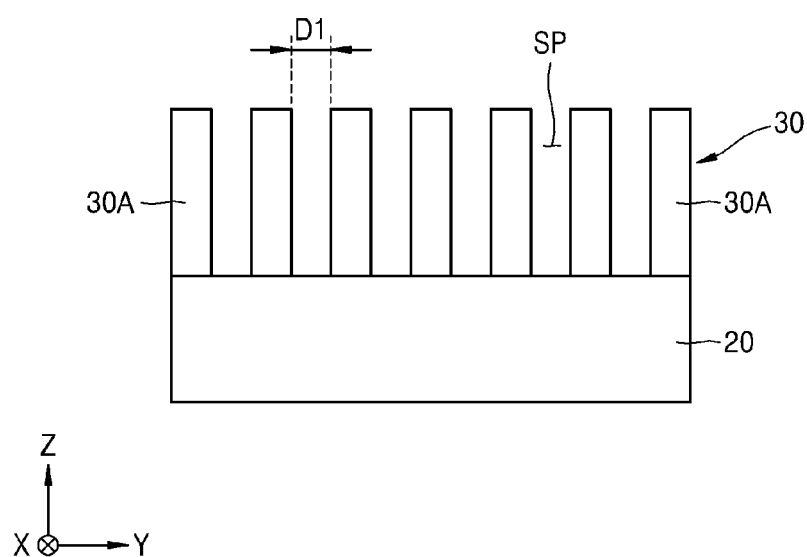
Figure 3A:
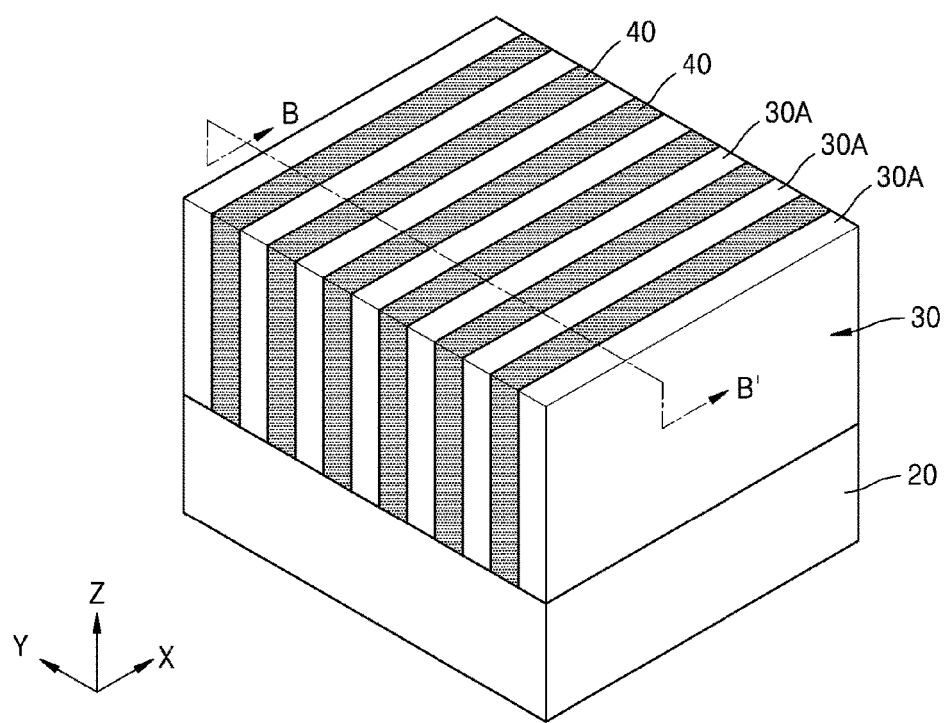
Figure 3B:
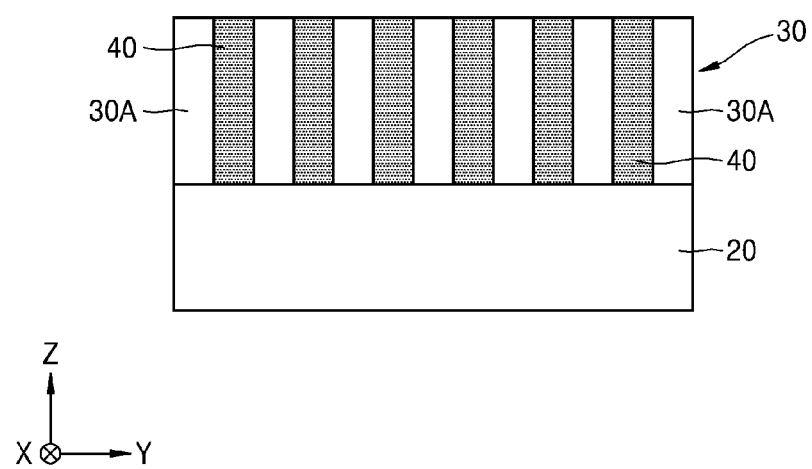

FIGS. 2A to 7B are schematic views for describing a method of manufacturing an IC device according to exemplary embodiments of the inventive concept, and in particular, FIGS. 2A, 3A, 4A, 5A, 6A, and 7A are perspective views of essential parts for describing sequential processes of manufacturing an IC device according to exemplary embodiments of the inventive concept, and FIGS. 2B, 3B, . . . , and 7B are cross-sectional views taken along lines B-B' of FIGS. 2A, 3A, 4A, 5A, 6A, and 7A, respectively.

Referring to FIGS. 1, 2A, and 2B, in process P12, a pattern structure 30 that includes a plurality of line patterns 30A extending parallel to one another in a first direction (X direction) with a space SP therebetween may be formed on a substrate 20.

The plurality of line patterns 30A may extend parallel to one another in the first direction (X direction). Every adjacent two of the plurality of line patterns 30A are separated from each other a first separation distance D1 by a space SP in a second direction (Y direction) that intersects the first direction (X direction).

The substrate 20 may include a semiconductor substrate. In some embodiments, the substrate 20 may include a semiconductor substrate such as a Si or Ge substrate. In some embodiments, the substrate 20 may include a compound semiconductor such as SiGe, SiC, GaAs, InAs, or InP. The substrate 20 may include a conductive region, for example, an impurity-doped well or an impurity-doped structure. The substrate 20 may have any of a variety of device isolation structures such as a shallow trench isolation (STI) structure. In some other embodiments, the substrate 20 may include a semiconductor substrate and an insulation layer or a conductive layer formed on the semiconductor substrate.

A material of the pattern structure 30 may be selected from a variety of materials. For example, the pattern structure 30 may be formed of a silicon oxide, a silicon nitride, a polysilicon, a metal, a metal oxide, a metal nitride, a semiconductor material, or a combination thereof. However, embodiments are not limited thereto. In some embodiments, the plurality of line patterns 30A may be formed of the same material as the substrate 20, and may be integrally formed with the substrate 20. In some embodiments, the plurality of line patterns 30A of the pattern structure 30 may be a semiconductor region integrally formed with the substrate 20. For example, the plurality of line patterns 30A may each constitute a fin type active region. In some other embodiments, the plurality of line patterns 30A of the pattern structure 30 may include a plurality of word lines or bit lines formed on the substrate 20. In some embodiments, the plurality of line patterns 30A may be formed of the same material of the substrate 20, and may be integrally formed on a portion of the substrate 20 and may include a part of the substrate 20.

In process P14 of FIG. 1, in process P14, at least one support structure 42 (see FIGS. 5A and 5B) that contacts an upper surface (e.g., the upper most surface) of the pattern structure 30 and extend in the second direction (Y direction) that intersects the first direction (X direction) may be formed.

FIGS. 1 and 3A to 5B are views illustrating exemplary methods of performing process P14 according to exemplary embodiments in which the at least one support structure 42 includes a plurality of line patterns.

In more detail, process 14 of FIG. 1 may be performed as follows. As illustrated in FIGS. 3A and 3B, a sacrificial pattern 40 that fills each of the spaces SP between the plurality of line patterns 30A of the pattern structure 30 may be formed on the substrate 20 with the pattern structure 30.

To form the sacrificial pattern 40, after a sacrificial layer (not shown) filling the spaces SP between the plurality of line patterns 30A and covering an upper surface of the pattern structure 30 is formed using a spin coating or deposition process, portions of the sacrificial layer may be removed to expose the supper surface of the pattern structure 30, so that the sacrificial pattern 40 may remain only in the spaces SP between the plurality of line patterns 30A. The sacrificial pattern 40 may be formed to have an upper surface extending on the same level as the upper surface of the pattern structure 30. For example, the uppermost surface of the sacrificial pattern 40 may extend to the same level as the uppermost surface of the pattern structure 30.

The sacrificial pattern 40 may be formed of a different material from a material of the pattern structure 30. In some embodiments, the sacrificial pattern 40 may be formed of a carbon-containing layer, for example, a spin-on hardmask (SOH) layer. The SOH layer may include a hydrocarbon compound having a comparatively high carbon content of about 85 wt % to about 99 wt % based on a total weight of the SOH layer, or a derivative of the hydrocarbon compound.

Figure 4A:
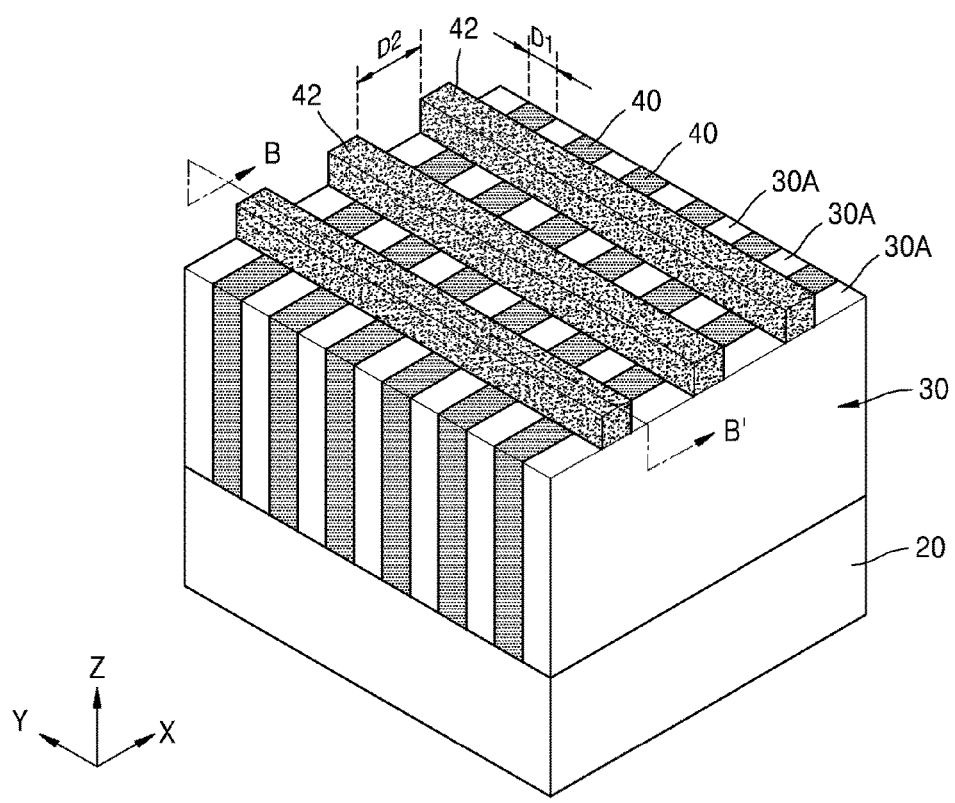
Figure 4B:
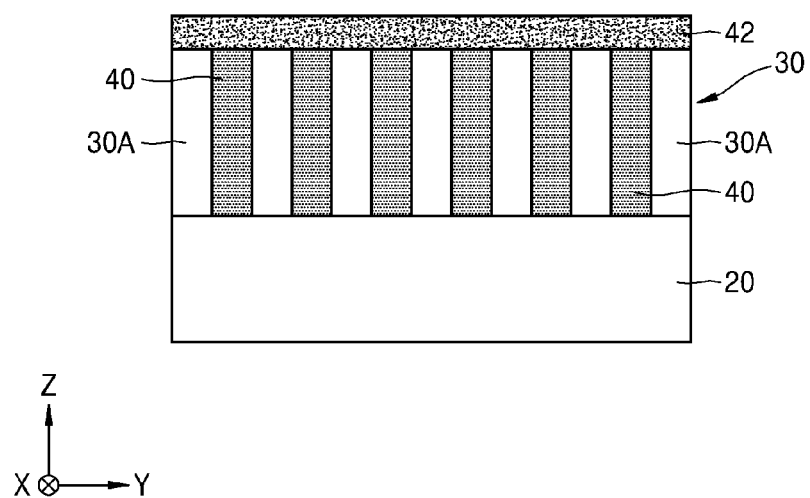

Next, as illustrated in FIGS. 4A and 4B, the support structure 42 that contacts the upper surface of the pattern structure 30 and the upper surface of the sacrificial pattern 40 may be formed on the pattern structure 30 and the sacrificial pattern 40. To form the support structure 42, after a support layer (not shown) that contacts the upper surface of the pattern structure 30 and the upper surface of the sacrificial pattern 40, the support layer may be patterned to form the support structure 42 including the remaining portions of the support layer. The support structure 42 may have a predefined height extending in a third direction (Z) perpendicular to a first (X) and a second (Y) directions. A bottom most surface of the support structure 42 contacts an uppermost surface of each of the line patterns 30A. The support structure 42, also referred to as a warpage-controlling structure, or a warpage-reducing structure, may have a grid-like shape, and may include certain bar-shaped or ridge-shaped parts.

The support structure 42 may be formed of a different material from the material of the sacrificial pattern 40. The support structure 42 may be formed of a material that may be the same as or different from the material of the pattern structure 30.

A lower surface of the support structure 42 that faces the substrate 20 may include a first local surface facing the upper surface of the pattern structure 30 and a second local surface facing the sacrificial pattern 40 that fills the spaces SP. As the upper surface of the sacrificial pattern 40 is formed to extend at the same level as the upper surface of the pattern structure 30, the lower surface of the support structure 42 may have a planar shape extending in the second direction (Y direction) without a step difference between the first local surface and the second local surface.

A second separation distance D2, as a shortest separation distance between every adjacent two of the plurality of support structures 42, may be greater than a first separation distance D1 between every adjacent two of the plurality of line patterns 30A. For example, a minimum separation distance between two adjacent support structures of the plurality of support structures 42 may be greater than a maximum separation distance between two adjacent line patterns of the plurality of line patterns 30A.

Figure 5A:
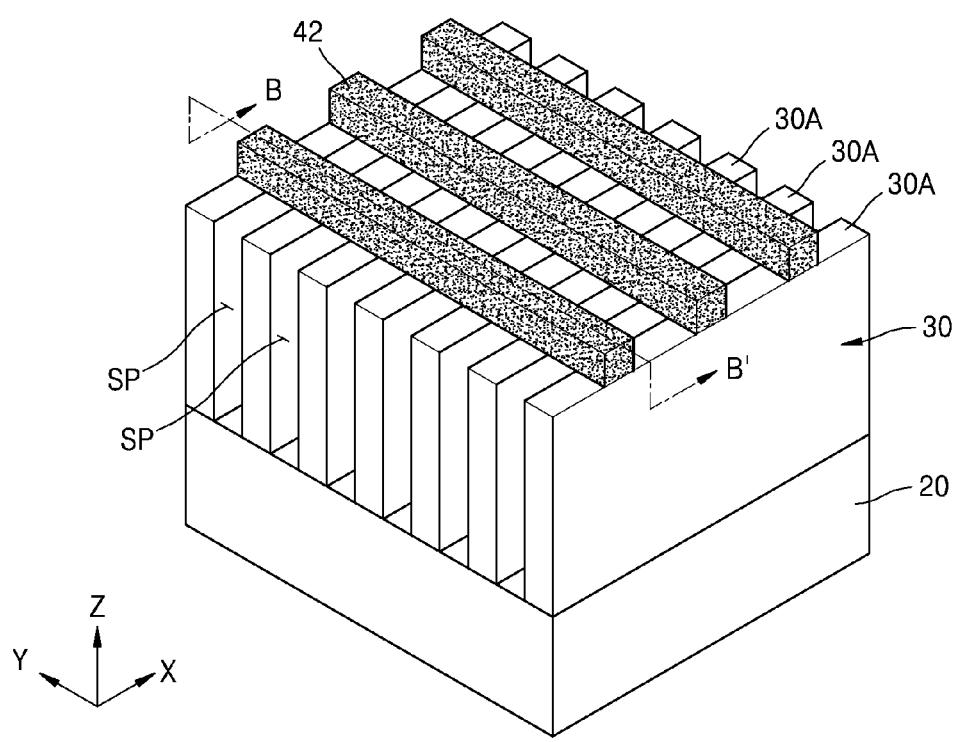
Figure 5B:
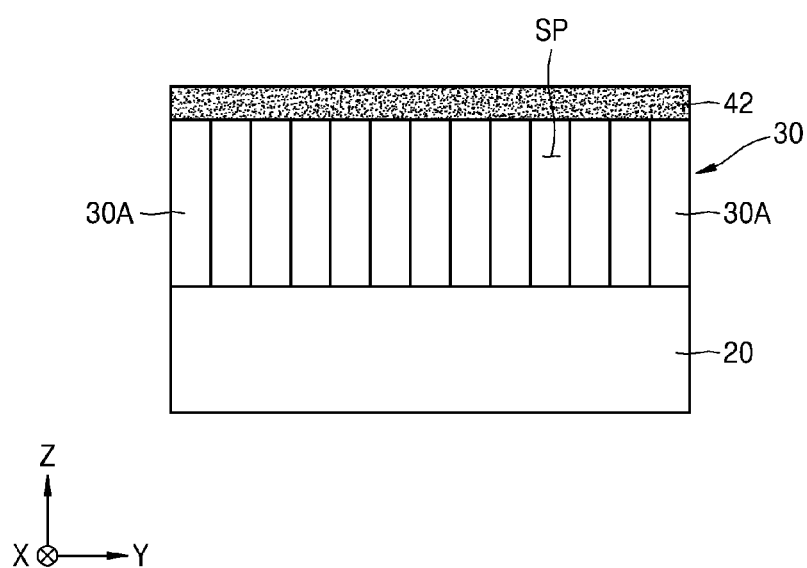

Referring to FIGS. 5A and 5B, the sacrificial pattern 40 (see FIGS. 4A and 4B) may be removed from the spaces SP between the plurality of line patterns 30A.

In some embodiments, the sacrificial pattern 40 may be removed using an ashing process and a strip process.

Figure 6A:
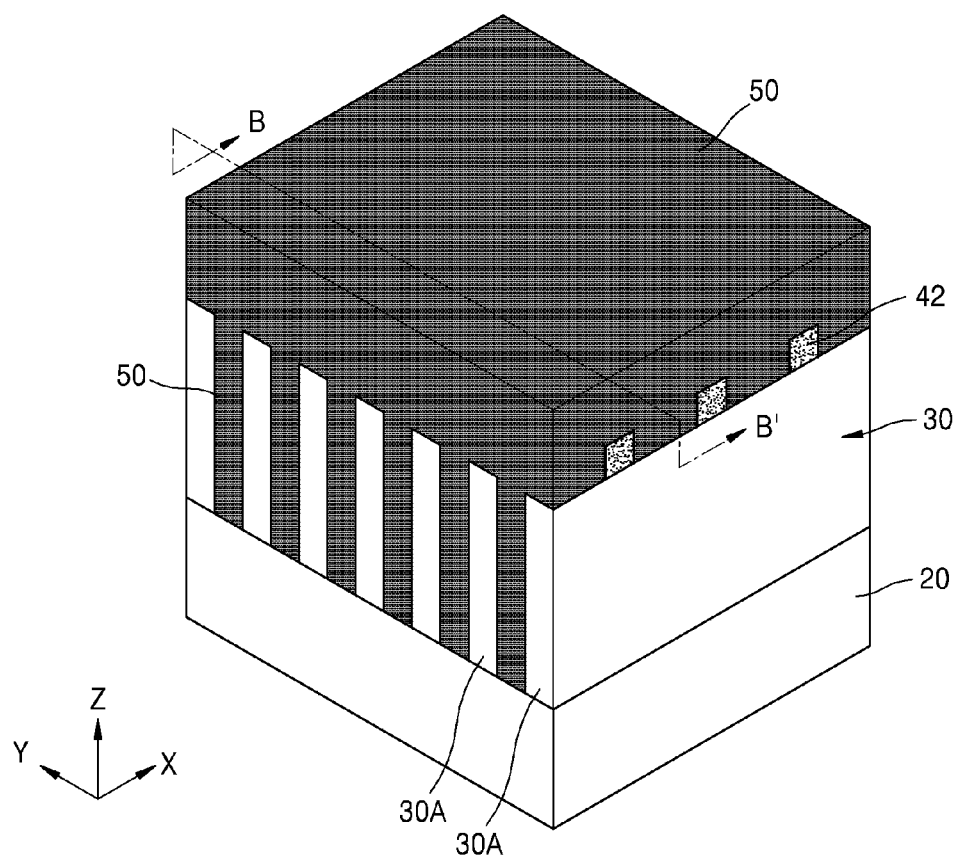
Figure 6B:
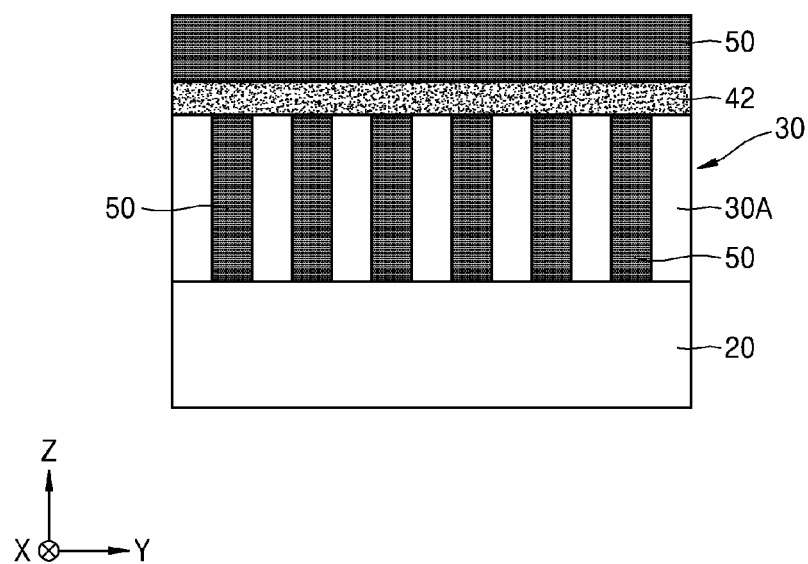

Referring to FIGS. 1, 6A and 6B, in process P16, a buried layer 50 may be formed to fill the spaces SP (see FIGS. 5A and 5B) between the plurality of line patterns 30. The support structure 42 contacts the upper surface of the pattern structure 30.

To form the buried layer 50, a buried material may be deposited in the spaces SP exposed through gap spaces between the plurality of support structures 42. As described above with reference to FIGS. 4A and 4B, the second separation distance D2 as the minimum separation distance between the adjacent two of the plurality of support structures 42 may be greater than the first separation distance D1 between the adjacent two of the plurality of line patterns 30A, the spaces SP may be fully filled without any interference from the plurality of support structures 42 or any concern about incomplete filling due to the plurality of support structures 42. The buried layer 50 may be formed to fill the spaces SP and cover the plurality of support structures 42.

The buried layer 50 may be formed of a conductive material or an insulating material. In some embodiments, the buried layer 50 may be a nitride layer, an oxynitride layer, an oxide layer, a metal-containing layer, or a combination thereof.

With the rapid down-scaling of IC devices, an aspect ratio of a plurality of line pattern 30A in a pattern structure 30 used to manufacture of an IC device has gradually increased, which makes the pattern structure 30 including the plurality of line patterns 30A vulnerable to warpage or collapse. Accordingly, when the buried layer 50 filling the spaces SP includes a material having a comparatively large residual stress without the plurality of support structures 42, warpage or collapse of the pattern structure 30 may occur during a deposition process of forming the buried layer 50. In some embodiments, when the buried layer 50 includes a material having a comparatively large residual stress, the plurality of support structure 42 may physically fix the pattern structure 30 to the original location thereof during the formation of the buried layer 50 with the plurality of support structures 42 contacting the upper surface of the pattern structure 30. Thus, warpage or collapse of the pattern structure 30 may be prevented during the formation of the buried layer 50, and pattern failure may also be inhibited.

Figure 7A:
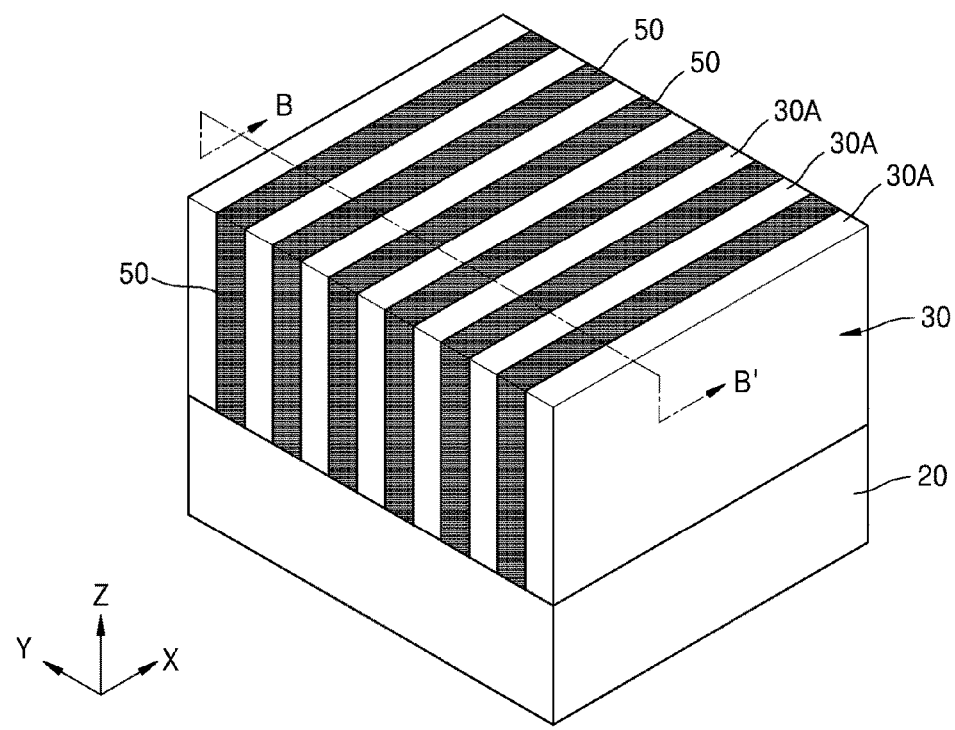
Figure 7B:
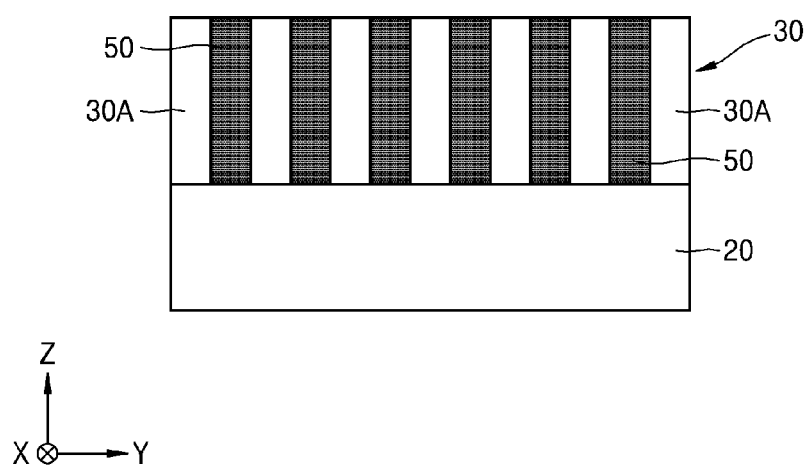

Referring to FIGS. 1, 7A and 7B, in process P18, the support structure 42 may be removed from the pattern structure 30 to expose the upper surface of the pattern structure 30.

To separate, and remove the support structure 42 from the pattern structure 30, a portion of the buried layer 50 on the pattern structure 30, and the support structure 42 may be removed by etch back or chemical mechanical polishing (CPM), so that the buried layer 50 remains only in the spaces SP between the plurality of line patterns 30A.

In some embodiments, at least portion of the support structure 42 or at least portion of the buried layer 50 may remain on the pattern structure 30.

According to the methods of manufacturing an IC device, according to the exemplary embodiments of the inventive concept described above with reference to FIGS. 1 to 7B, the buried layer 50 that fills the spaces SP between the plurality of line patterns 30A may be formed using the support structure 42 having a simplified structure formed by low-cost and simple processes, while the location and shape of a plurality of line patterns 30A having a comparatively high aspect ratio remain fixed. Thus, even when a material having a comparatively large residual stress is used as the material of the buried layer 50, warpage or collapse of the pattern structure 30 may be prevented during a deposition process of forming the buried layer 50, and a pattern failure may be inhibited, which consequentially may improve the manufacturing yield IC devices and ensure the IC device with improved reliability.

Figure 8A:
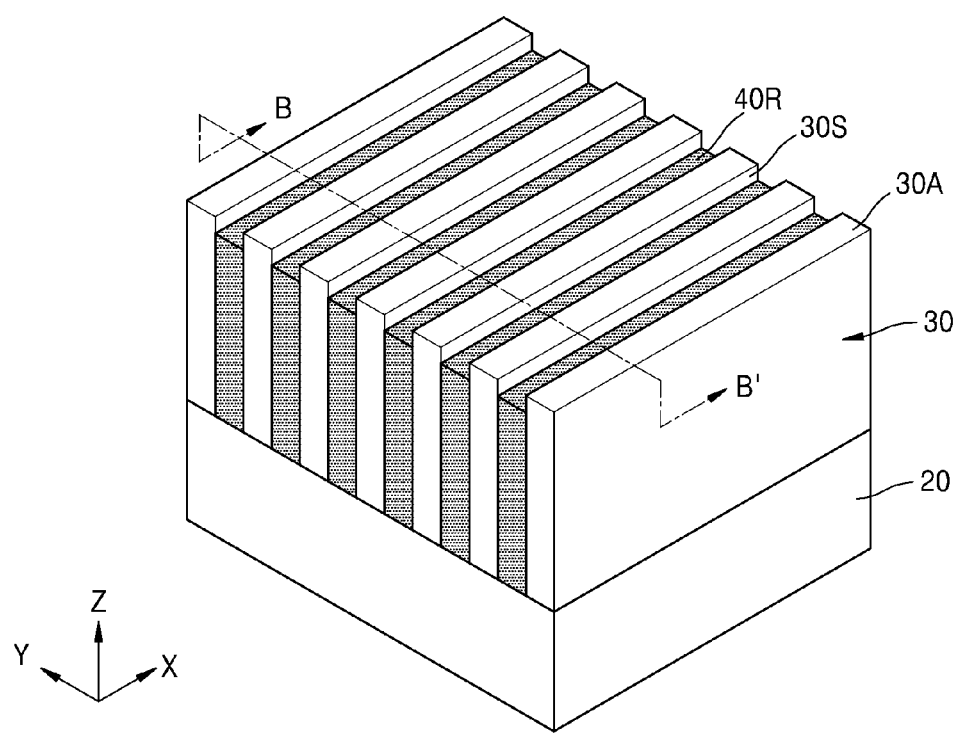
Figure 8B:
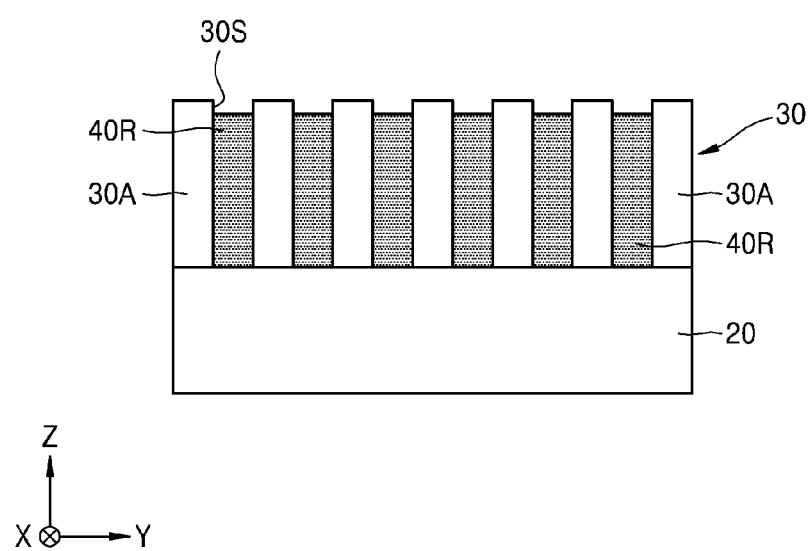
Figure 9A:
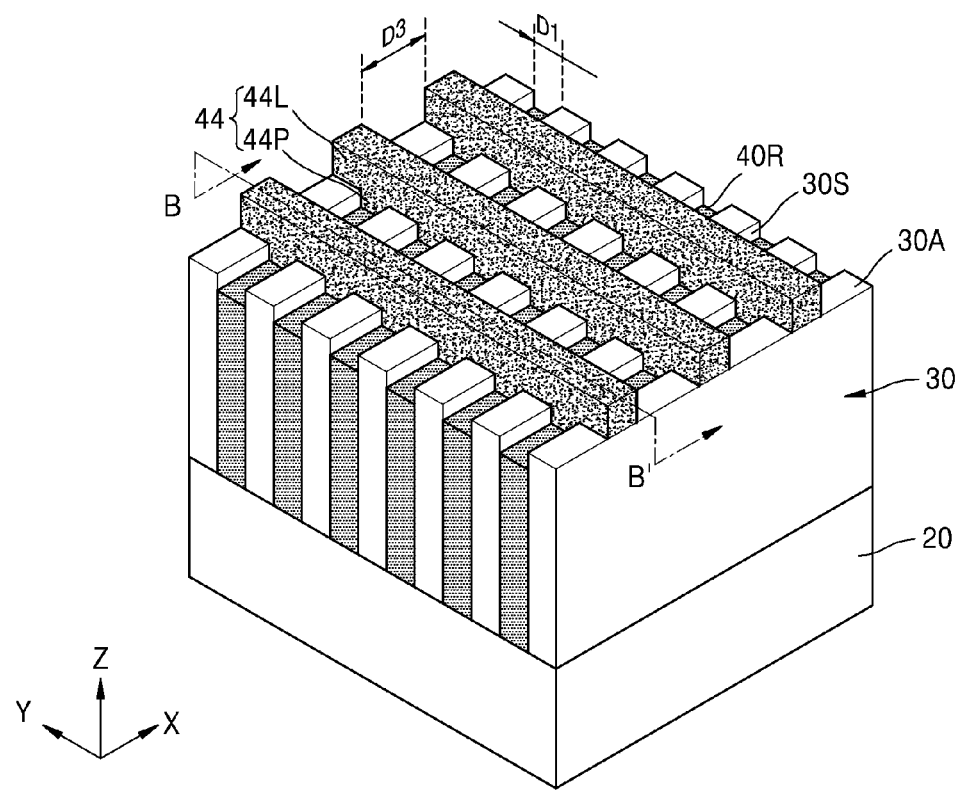
Figure 9B:
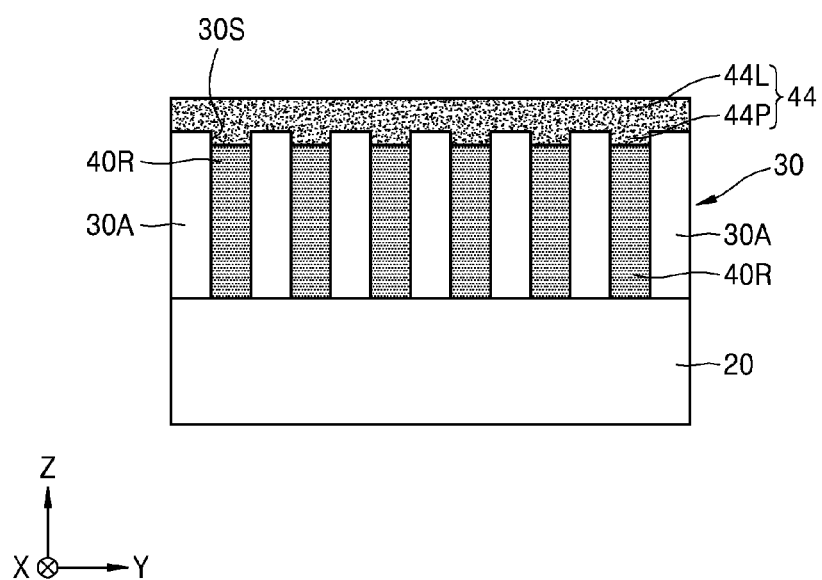
Figure 10A:
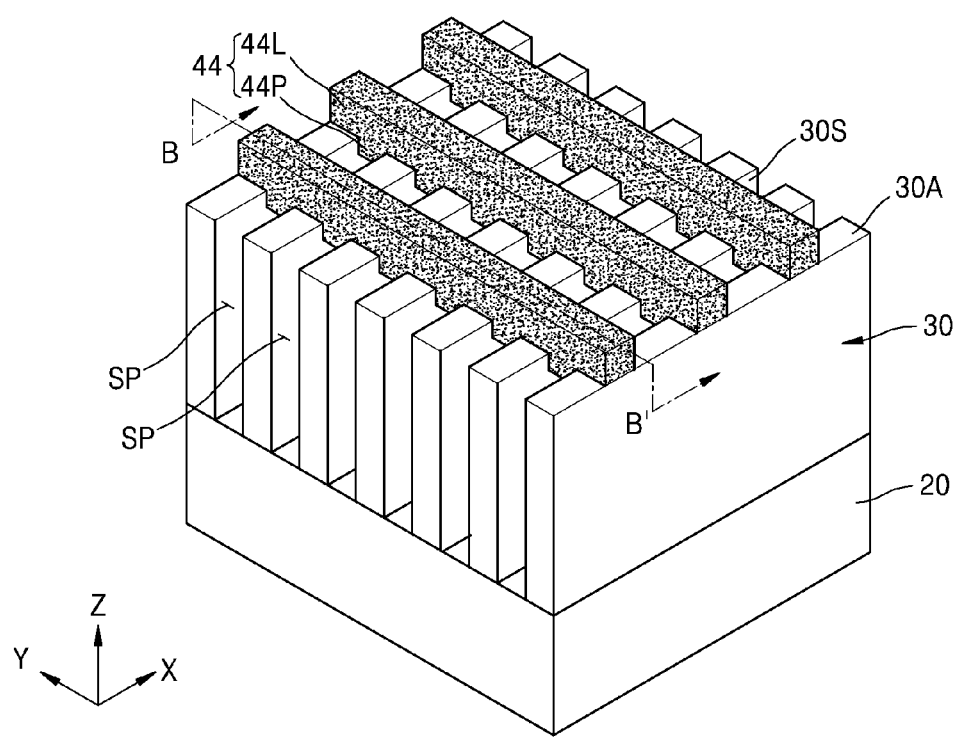
Figure 10B:
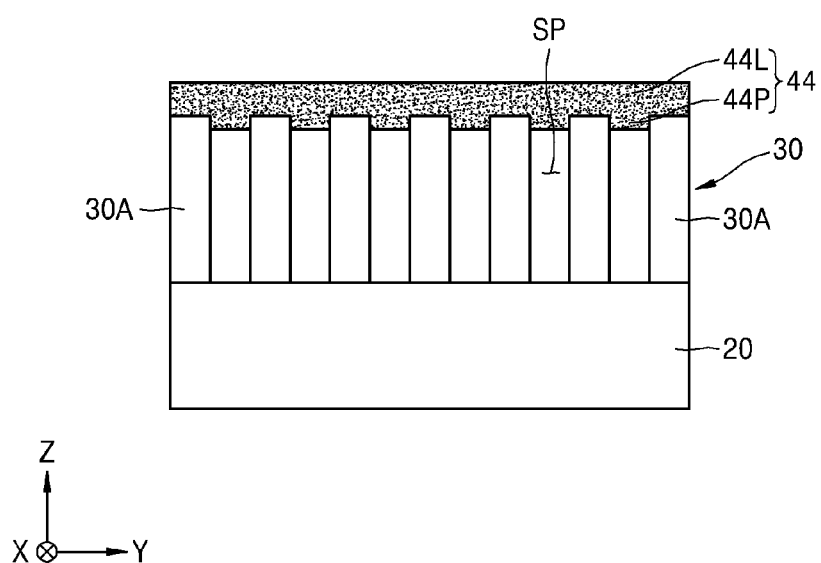

FIGS. 8A to 10B are schematic views for describing a method of manufacturing an IC device according to exemplary embodiments of the inventive concept, and in particular, FIGS. 8A, 9A, and 10A are perspective views of essential parts for describing sequential processes of manufacturing an IC device according to exemplary embodiments of the inventive concept, and FIGS. 8B, 9B, and 10B are cross-sectional views taken along lines B-B' of FIGS. 8A, 9A, and 10A, respectively. In FIGS. 8A to 10B, like reference numerals as those of FIGS. 2A to 7B refer to like elements throughout, and thus redundant description thereof will be omitted.

Referring to FIGS. 8A and 8B, after forming the pattern structure 30 on the substrate 20 in a similar manner as the method of forming the sacrificial pattern 40 described above with reference to FIGS. 3A and 3B, a recess sacrificial pattern 40R (also referred to as a recessed sacrificial pattern) that fills the spaces SP of the plurality of line patterns 30A of the pattern structure 30 may be formed. The recess sacrificial pattern 40R may be formed to have an upper surface (e.g., upper most surface) that extends at a lower level than the upper surface (e.g., upper most surface) of the pattern structure 30. The upper surface of the pattern structure 30 and the opposite sidewalls of the line patterns 30A of the pattern structure 30, adjacent to the upper surface thereof, may be exposed after the formation of the recess sacrificial pattern 40R. A detailed structure of the recess sacrificial pattern 40R may be the same as that of the sacrificial pattern 40 as described above with reference to FIGS. 3A and 3B.

Referring to FIGS. 9A and 9B, a support structure 44 that contacts the upper surface and the opposite sidewalls of the pattern structure 30 and the upper surface of the recess sacrificial pattern 40R may be formed on the pattern structure 30 and the recess sacrificial pattern 40R in a similar manner as described above with reference to FIGS. 4A and 4B. To form the support structure 44, after forming a supporting layer (not shown) that contacts the upper surface and the opposite sidewalls of the pattern structure 30 and the upper surface of the recess sacrificial pattern 40R, the support layer may be patterned to thereby form the support structure 44.

The support structure 44 may include a linear portion 44L that contacts the upper surface of the pattern structure 30 and extends on the pattern structure 30 and the recess sacrificial pattern 40R in a direction that intersects an extending direction of the line patterns 30A of the pattern structure 30, and a plurality of protruding portions 44P that protrude from the linear portion 44L toward the substrate 20 and contact the sidewalls of the line patterns 30A of the pattern structure 30. For example, a first height of the support structure 44 extending in a third (Z) direction from a contact surface between the plurality of protruding portions 44P and the recess sacrificial pattern 40R is larger than a second height of the support structure 44 extending in the third (Z) direction from a contact surface between the linear portion 44L and the pattern structure 30. A detailed structure of the support structure 44 may be the same as that of the support structure 42 described above with reference to FIGS. 5A and 5B.

A lower surface of the support structure 44 that faces the substrate 20 may include a first local surface that faces the upper surface of the pattern structure 30 and a second local surface that faces the upper surface of the recess sacrificial pattern 40R filling the spaces SP (see FIGS. 2A and 2B). As the upper surface of the recess sacrificial pattern 40R extends at a lower level than the upper surface of the pattern structure 30, the lower surface of the support structure 44 may have a step difference between the first local surface and the second local surface, and may extend with an uneven shape in the second direction (Y direction).

A third separation distance D3 as a minimum separation distance between adjacent two of the plurality of support structures 44 may be greater than the first separation distance D1 between the adjacent two of the line patterns 30A of the pattern structure 30.

Referring to FIGS. 10A and 10B, the recess sacrificial pattern 40R (see FIGS. 9A and 9B) may be removed from the spaces SP between the plurality of line patterns 30A in a similar manner as described above with reference to FIGS. 5A and 5B.

Next, a buried layer 50 that fills the spaces SP between the plurality of line patterns 30A may be formed by performing the processes as described above with reference to FIGS. 6A to 7B.

According to the methods of manufacturing an IC device, according to the embodiments of the inventive concept described above with reference to FIGS. 8A to 10B, the buried layer 50 that fills the spaces SP between the plurality of line patterns 30A may be formed using the support structure 44 having a simplified structure formed by low-cost and simple processes, while the location and shape of a plurality of line patterns 30A having a comparatively high aspect ratio remain fixed. For example, as the support structure 44 includes the linear portion 44L that extends on the pattern structure 30 and the recess sacrificial pattern 40R and contacts the upper surface of the pattern structure 30, and the plurality of protruding portions 44P that contacts the sidewalls 30A of the line patterns 30A of the pattern structure 30, the upper surface and the sidewalls of the pattern structure 30 may be fixed by the support structure 44, so that the binding strength between the pattern structure 30 and the support structure 44 may be further improved, and the plurality of line patterns 30A may be physically fixed to be more stable enough to retain the original location and shape thereof. Thus, even when a material having a comparatively large residual stress is used as the material of the buried layer 50, warpage or collapse of the plurality of line patterns 30A may be prevented during the deposition process of forming the buried layer 50, and a pattern failure may be inhibited.

Figure 14A:
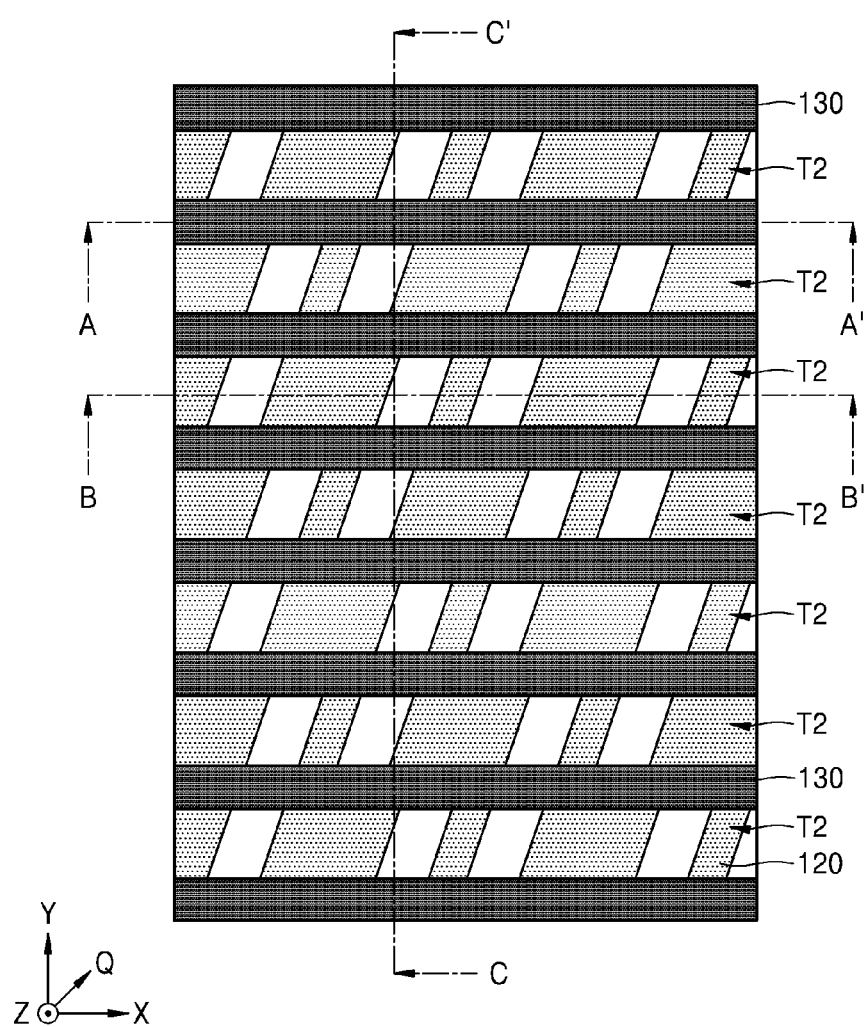
Figure 14B:
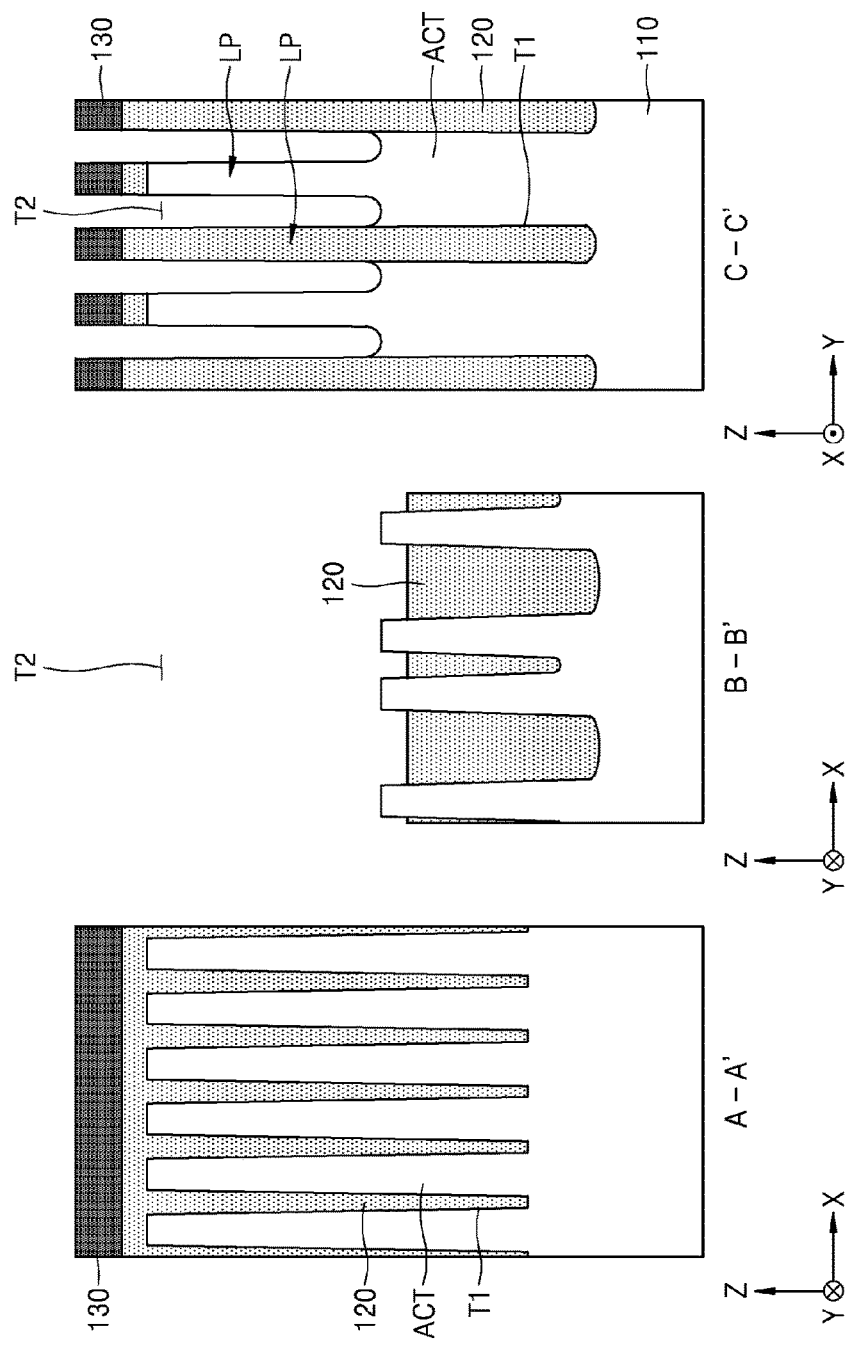
Figure 15A:
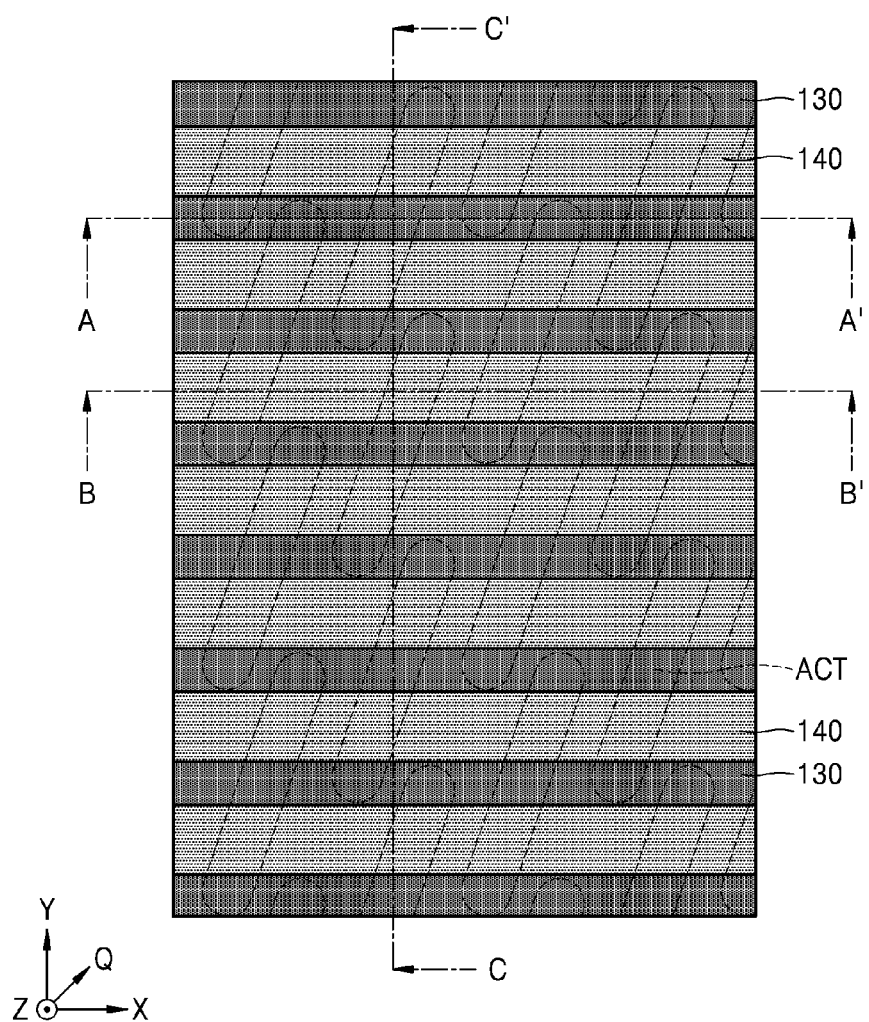
Figure 15B:
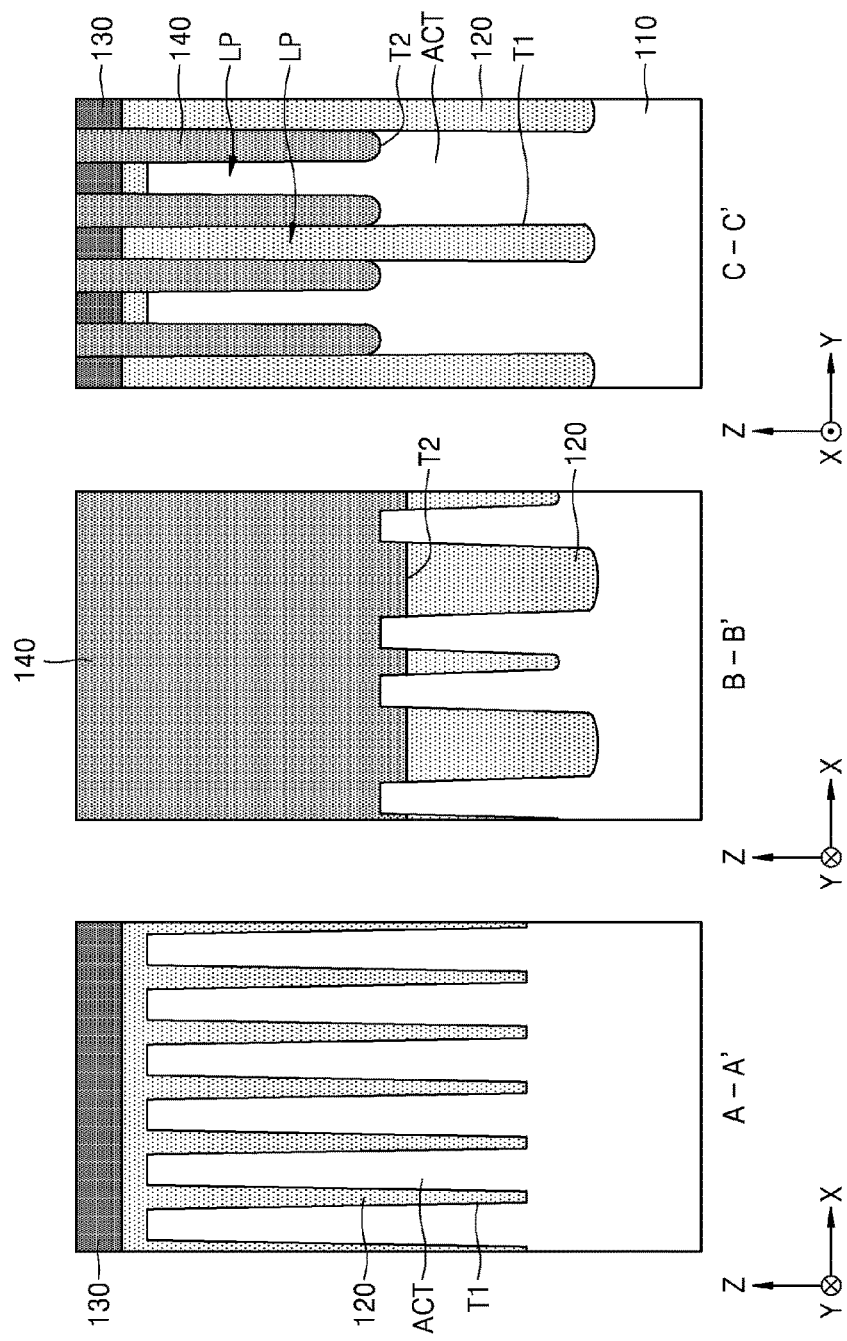
Figure 16A:
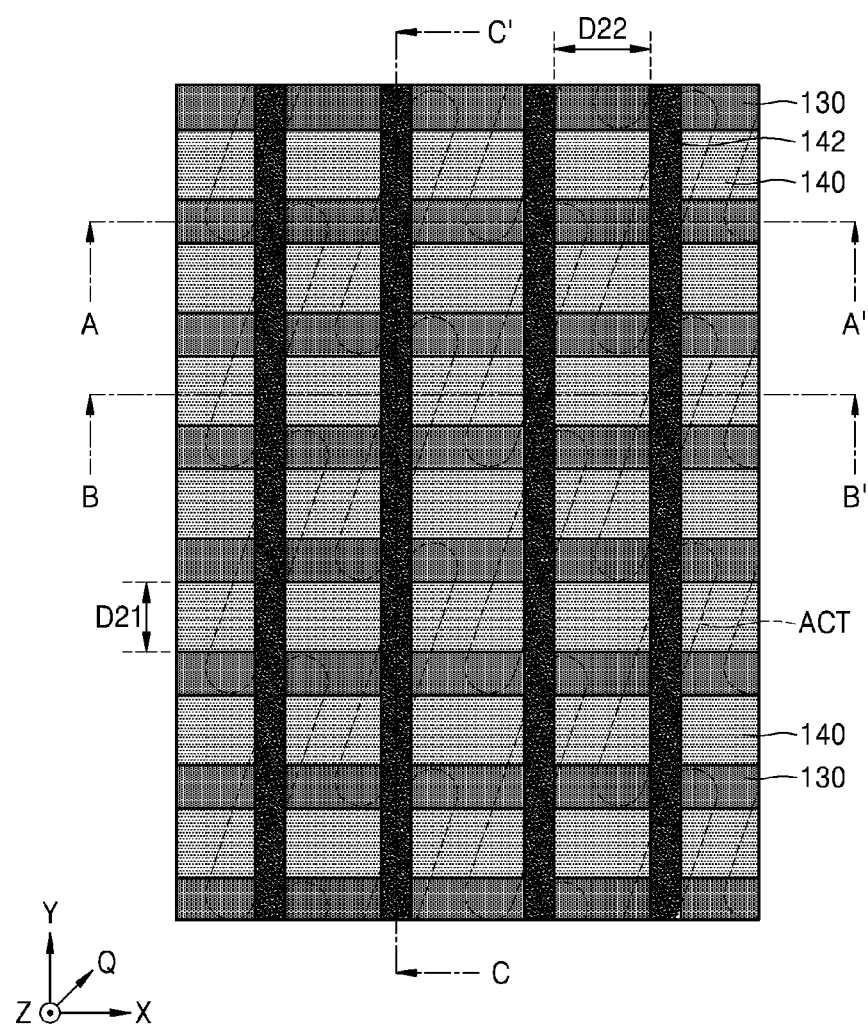
Figure 16B:
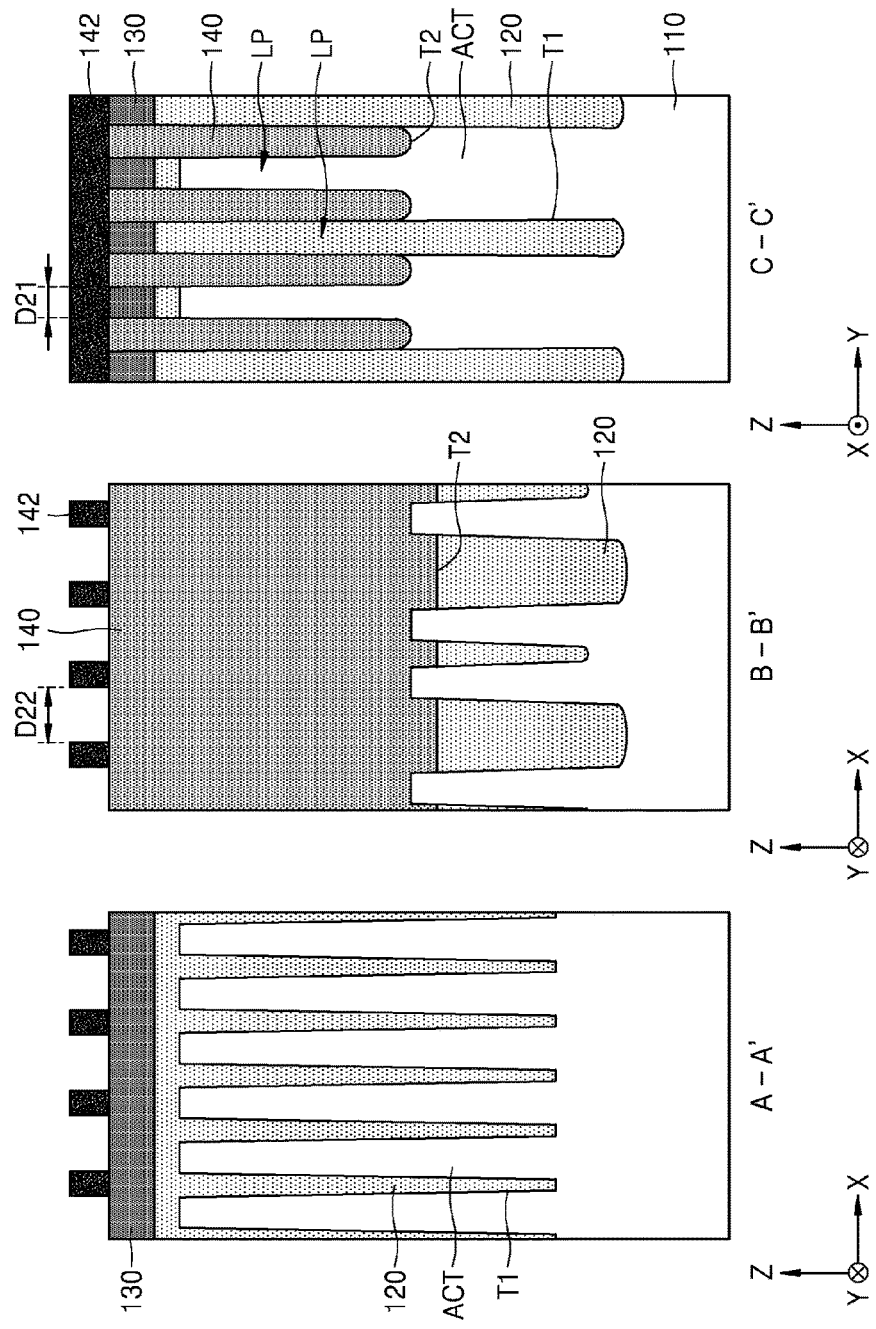
Figure 17:
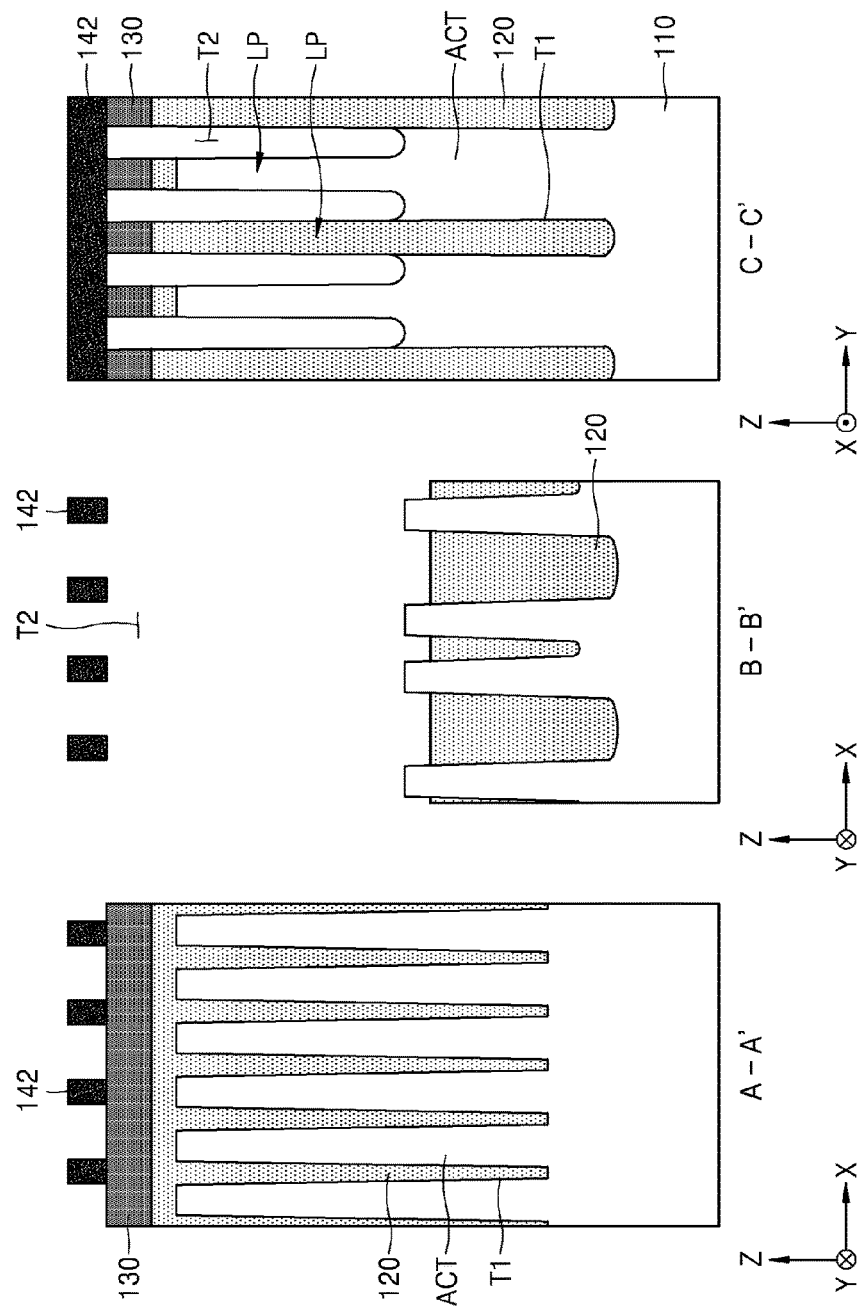
Figure 18A:
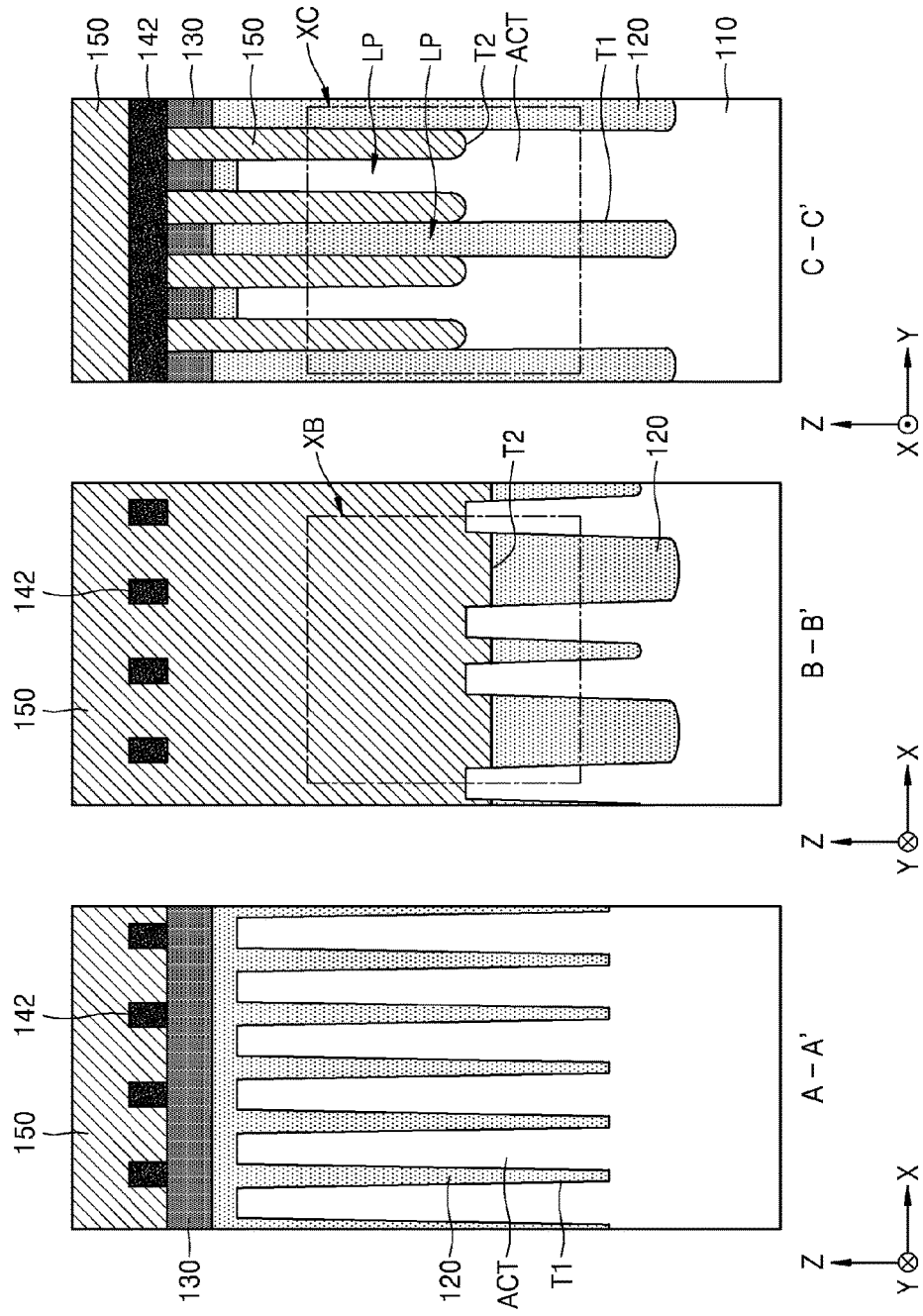
Figure 18B:
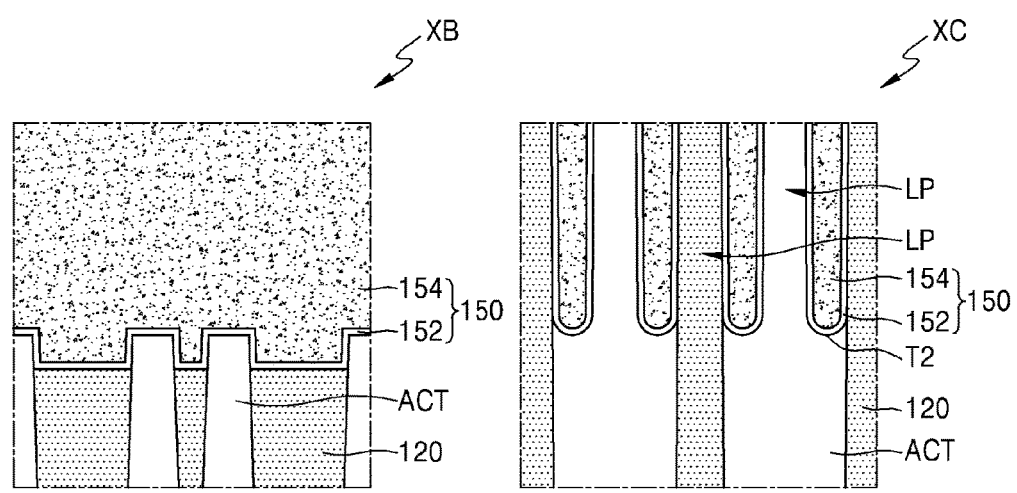
FIG. 18B is a magnified cross-sectional view illustrating "XB" and "XC" regions denoted by dot-and-dashed lines in FIG. 18A.

FIGS. 11A to 20 are schematic views for describing a method of manufacturing an IC device according to exemplary embodiments of the inventive concept, and in particular, FIGS. 11A, 12A, 13A, 14A, 15A, and 16A are plan views for describing sequential processes of manufacturing an IC device according to exemplary embodiments of the inventive concept, FIGS. 11B, 12B, 13B, 14B, and 16B are cross-sectional views taken along lines A-A', lines B-B', and lines C-C' of FIGS. 11A, 12A, 13A, 14A, 15A, and 16A, respectively, FIGS. 17, 18A, 19, and 20 are cross-sectional views illustrating sequential processes after the processes illustrated in FIGS. 16A and 16B, and FIG. 18B is a magnified cross-sectional view illustrating "XB" and "XC" regions denoted by dot-and-dashed lines in FIG. 18A.

Figure 11A:
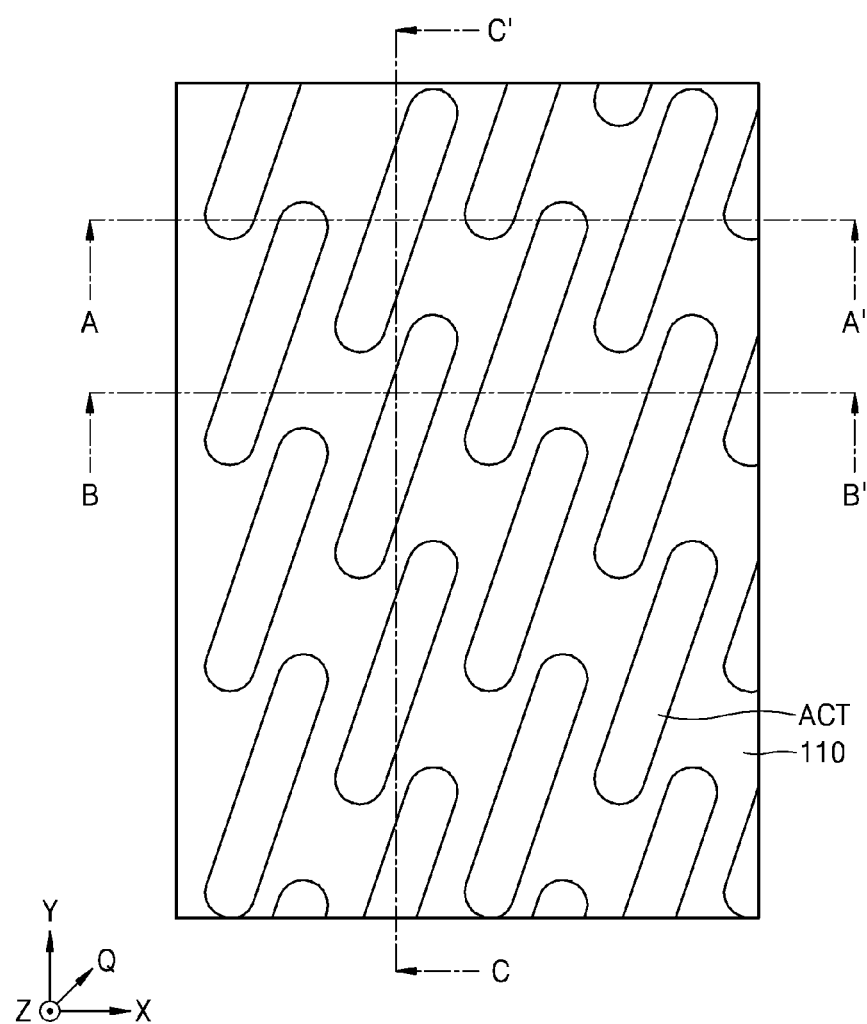
Figure 11B:
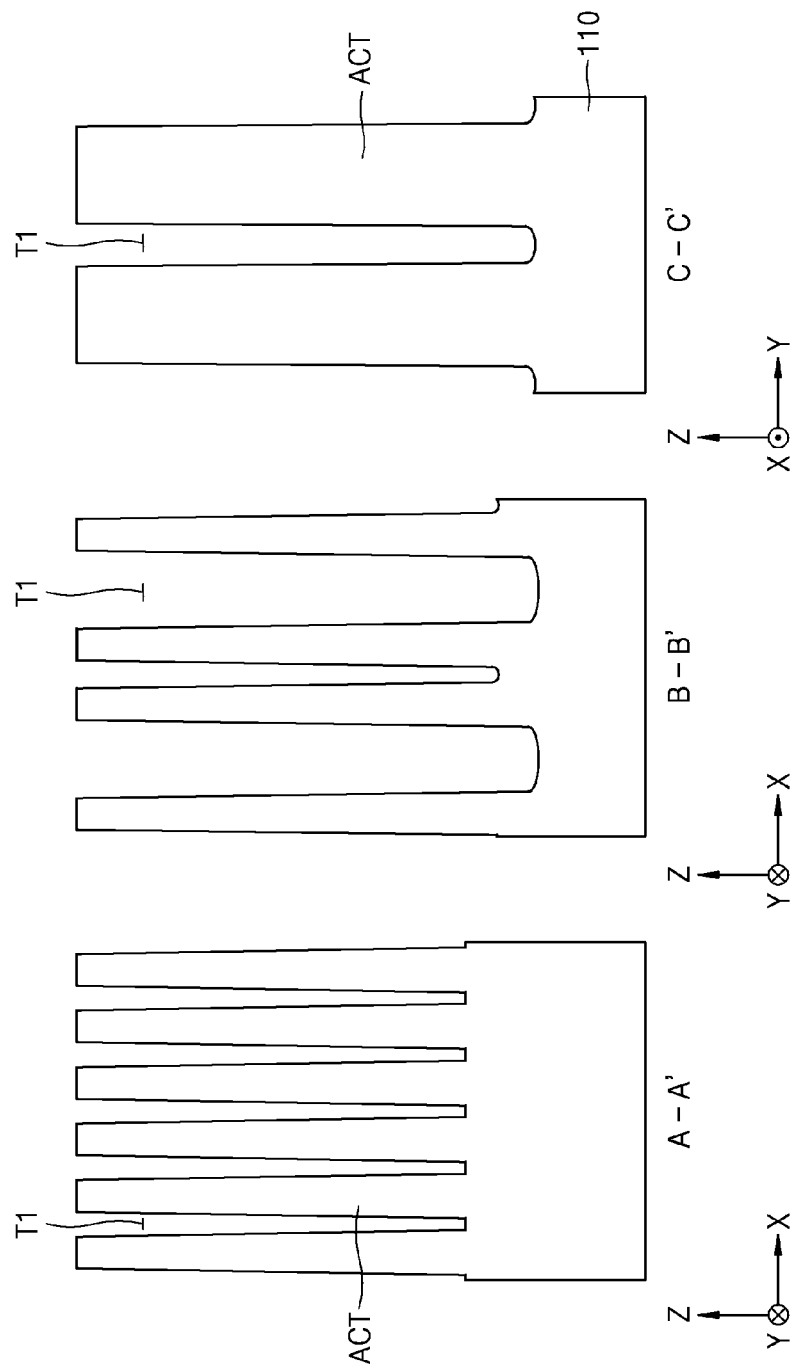
FIGS. 11B, 12B, 13B, 14B, 15B, and 16B are cross-sectional views taken along lines A-A', lines B-B', and lines C-C' of FIGS. 11A, 12A, 13A, 14A, 15A, and 16A, respectively.

Referring to FIGS. 11A and 11B, derive isolation trenches T1 that define a plurality of active regions ACT may be formed in a substrate 110.

Details of the substrate 110 may be the same those of the substrate 20 described above with reference to FIGS. 2A and 2B, and will not be provided here.

As illustrated in FIG. 11A, the plurality of active regions ACT may be formed as a repeating pattern, separated from one another in the X direction and the Y direction. The plurality of active regions ACT may have a shape with a major axis that extends in a diagonal direction (Q direction in FIG. 11A) with respect to the X direction and the Y direction.

In some embodiments, some of the device isolation trenches T1 may be formed to have a comparatively wide width and a comparatively deep depth, while some of the device isolation trenches T1 may be formed to have a comparatively narrow width and a comparatively shallow depth.

Figure 12A:
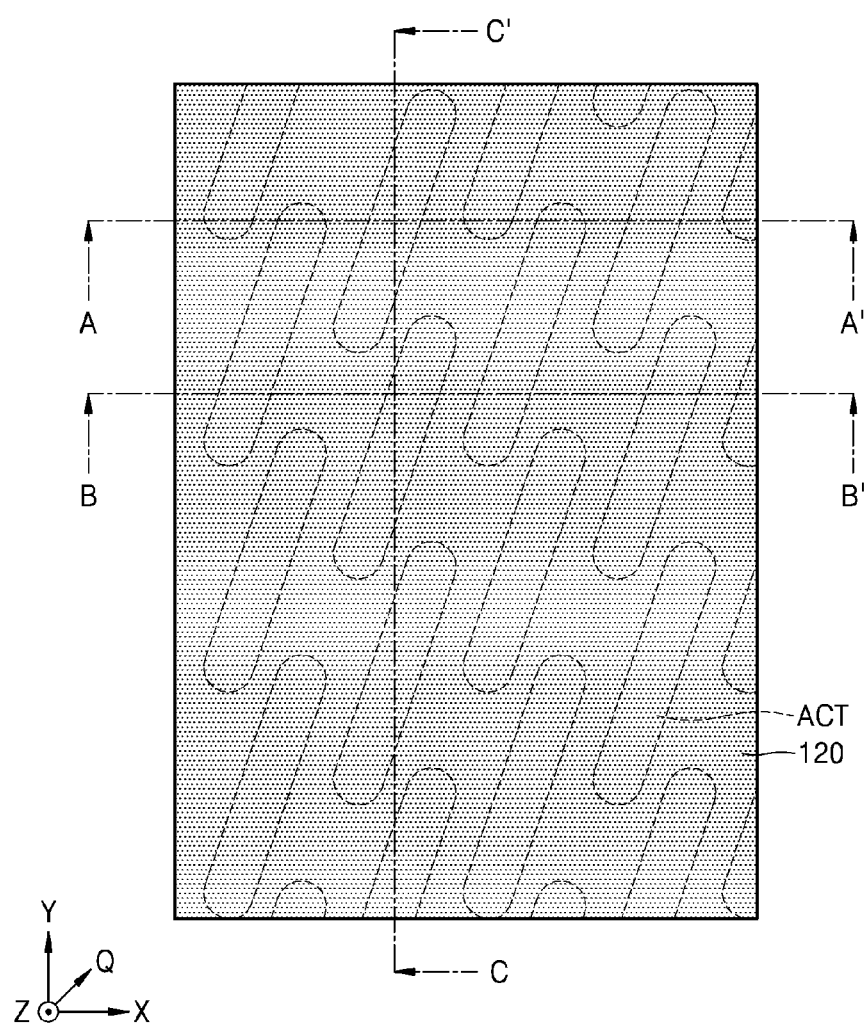
Figure 12B:
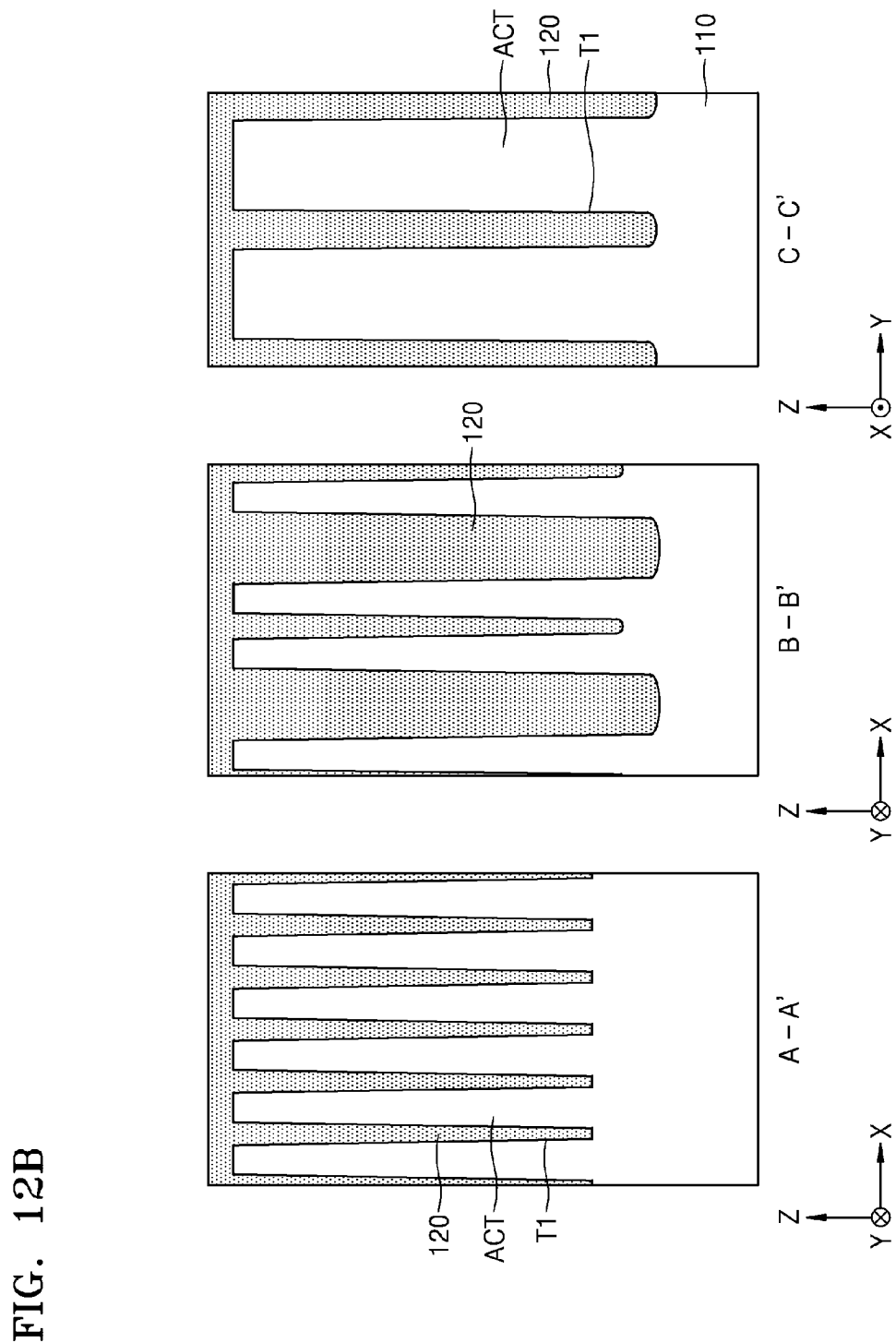

Referring to FIGS. 12A and 12B, a device isolation layer 120 that fills the device isolation trenches T1 surrounding the plurality of active regions ACT may be formed.

The device isolation layer 120 may be formed to cover the upper surfaces of the plurality of active regions ACT. In FIG. 12A, the locations of the plurality of active regions ACT are denoted by dashed lines to help understanding. Portions of the device isolation layer 120 that cover the upper surfaces of the plurality of active regions ACT may protect the surface of the substrate 110 in a subsequent ion implantation process of implanting impurity ions into the substrate or in a subsequent etching process.

The device isolation layer 120 may be formed of a silicon oxide layer, a silicon nitride layer, or a combination thereof. The device isolation layer 120 may be formed using at least one process selected from an atomic layer deposition (ALD) process, a chemical vapor deposition (CVD) process, a radical oxidation process, or a native oxidation process.

Figure 13A:
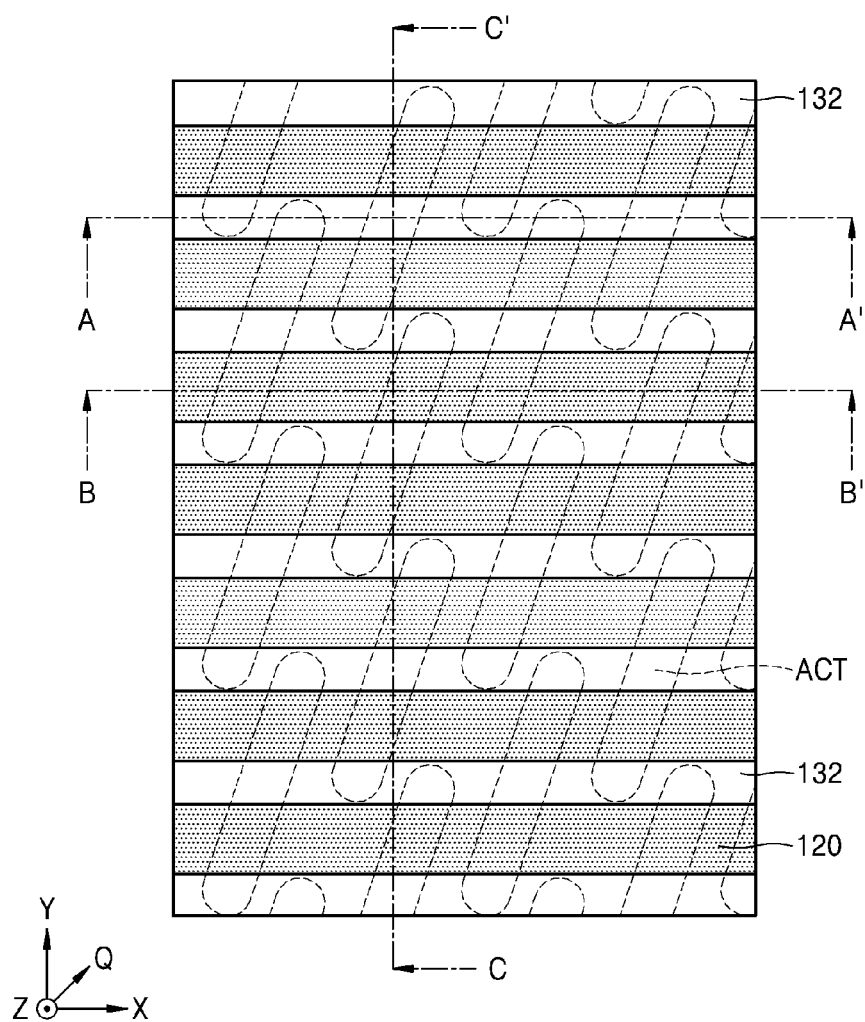
Figure 13B:
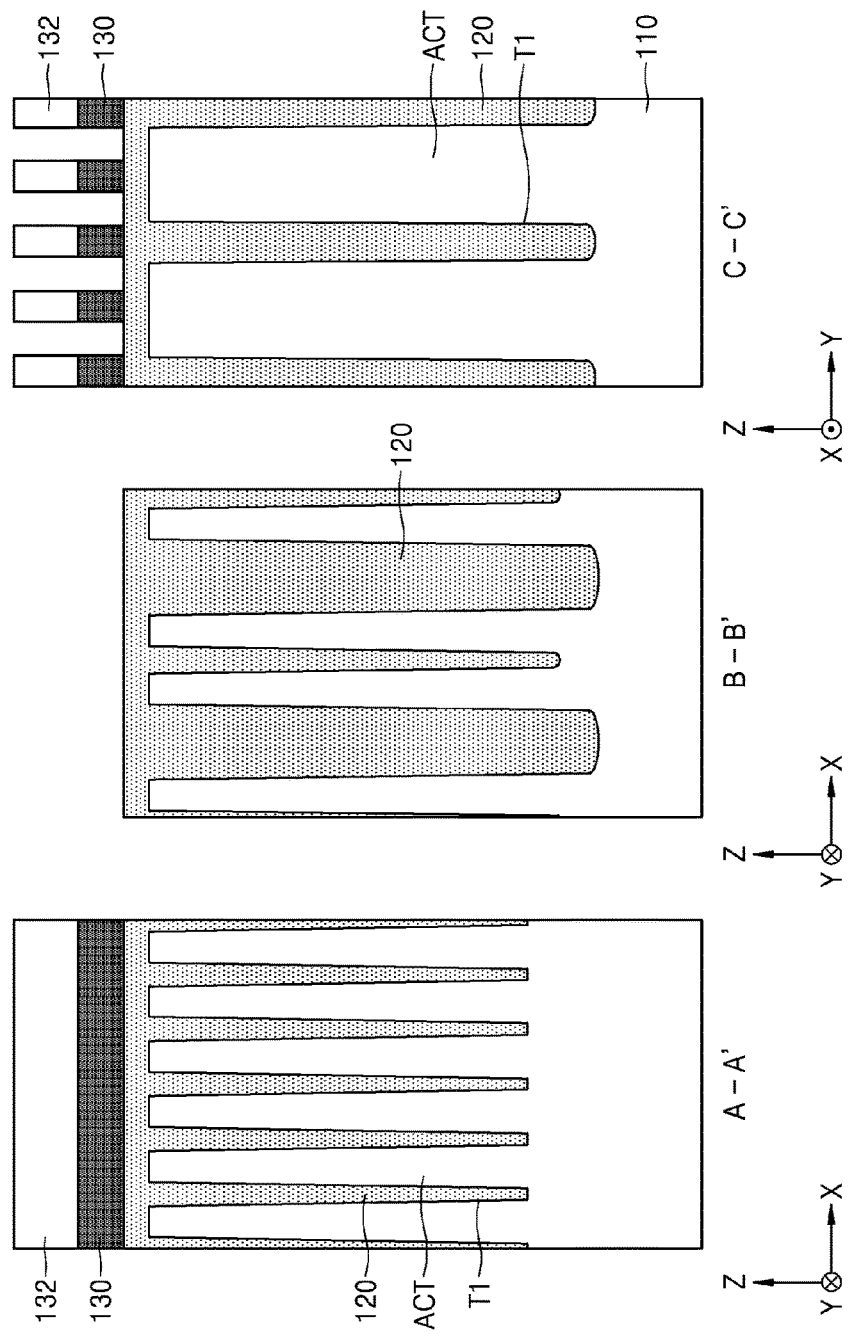

Referring to FIGS. 13A and 13B, a plurality of mask line patterns 130 and 132 that extend parallel to one another in the X direction, separated from one another, may be formed on the plurality of active regions ACT and the device isolation layer 120.

The plurality of mask line patterns 130 and 132 may be formed as multilayered hard mask patterns. For example, the plurality of mask line patterns 130 and 132 may have a sequential stack structure of a hard mask pattern 130 formed of an oxide, and an etch mask pattern 132 formed of a material having a different etch selectivity from that of the hard mask pattern 130, for example, a nitride, a polysilicon, a spin-on hardmask (SOH), a photoresist, or a combination thereof. However, embodiments are not limited thereto.

Referring to FIGS. 14A and 14B, a plurality of space lines T2 that extend parallel to one another in the X direction, and a plurality of line patterns LP that define the plurality of space lines T2 may be formed by etching the plurality of active regions ACT and the device isolation layer 120 with the plurality of mask line patterns 130 and 132 as an etch mask.

After the formation of the plurality of line patterns LP, the etch mask pattern 132 may be removed to expose the upper surface of the hard mask pattern 130.

The plurality of line patterns LP may include some of the plurality of active regions ACT, portions of the device isolation layer 120, and the hard mask pattern 130 as part of the plurality of mask line patterns 130 and 132.

Portions of the substrate 110 and portions of the device isolation layers 120 may be exposed by the plurality of space lines T2. As illustrated in a cross-sectional view of FIG. 14B taken alone line B-B', the portions of the substrate 110 exposed by the plurality of space lines T2 may be at a higher level than the exposed portions of the device isolation layer 120. For example, the uppermost surface of the portions of the substrate 110 exposed by the plurality of space lines T2 may be at a higher level than the uppermost surface of the exposed portions of the device isolation layer 120.

Referring to FIGS. 15A and 15B, a sacrificial pattern 140 that fills the plurality of line spaces T2 (see FIG. 14B) may be formed. The sacrificial pattern 140 may be formed to have an upper surface that extends at the same level as the upper surface of the plurality of line patterns LP. In the present embodiments, as the hard mask pattern 130 is exposed on the upper surface of the plurality of line patterns LP, the upper surface of the sacrificial pattern 140 may be at the same level as the upper surface of the hard mask pattern 130. The sacrificial pattern 140 may be formed of a different material from the material of the plurality of line patterns LP. A detailed structure of the sacrificial pattern 140 may be the same as that of the sacrificial pattern 40 described above with reference to FIGS. 3A and 3B, and thus will not be provided here.

Referring to FIGS. 16A and 16B, a support structure 142 may be formed on the plurality of line patterns LP and the sacrificial pattern 140 to contact the upper surfaces of the plurality of line patterns LP and the upper surface of the sacrificial pattern 140.

The support structure 142 may include a plurality of line patterns that extend on the plurality of line patterns LP, parallel to one another in the Y direction and separated from one another by a predefined distance.

To form the support structure 142, after forming a support layer (not shown) that contacts the upper surfaces of the plurality of line patterns LP and the upper surface of the sacrificial pattern 140, the support layer may be patterned to thereby form the support structure 142.

The support structure 142 may be formed of a different material from the material of the sacrificial pattern 140. The support structure 142 may be formed of a material that may be the same as or different from the material of the plurality of line patterns LP.

A lower surface of the support structure 142 that faces the substrate 110 may include a first local surface that faces and contacts the upper surfaces of the plurality of line patterns LP and a second local surface that faces and contacts the sacrificial pattern 140 filling the plurality of space lines T2. As the upper surface of the sacrificial pattern 140 extends at the same level as the upper surface of the plurality of line patterns LP, the lower surface of the support structure 142 may have a planar shape extending in the Y direction without a step difference between the first local surface and the second local surface.

A minimum separation distance D22 between adjacent two of the plurality of support structures 142 may be greater than a maximum separation distance D21 between adjacent two of the plurality of line patterns LP.

Referring to FIG. 17, the sacrificial pattern 140 (see FIGS. 16A and 16B) may be removed from the space lines T2 between the plurality of line patterns LP.

In some embodiments, the sacrificial pattern 140 may be removed using an ashing process and a strip process.

Referring to FIGS. 18A and 18B, a word line structure 150 that fills the space lines T2 between the plurality of line patterns LP may be formed while the support structure 142 contacts the upper surfaces of the plurality of line patterns LP.

As illustrated in FIG. 18B, the word line structure 150 may include a gate insulation layer 152 that contacts the surface of the substrate 110 and the surface of the device isolation layer 120 in the space lines T2, and a buried word line 154 that is on the gate insulation layer to fill the remaining spaces of the space lines T2.

As illustrated in FIGS. 18A and 18B, the exposed portions of the substrate 110 on the lower surface of the plurality of space lines T2 may be at a higher level than the exposed portions of the device isolation layers 120, so that the lower surface of the buried word line 154 may have an uneven shape corresponding to the lower surface profile of the plurality of space lines T2. Therefore, saddle fin-type transistors (FinFET) may be formed in the plurality of active regions ACT.

In some embodiments, the gate insulation layer 152 may be formed of an oxide layer by ALD. In some embodiments, the gate insulation layer 152 may be formed of a silicon oxide, $HfO_2$, $Al_2O_3$, $HfAlO_3$, $Ta_2O_3$, $TiO_2$, or ONO (oxide/nitride/oxide). However, embodiments are not limited thereto. The buried word line 154 may be formed of a metal, a metal nitride, or a combination thereof. In some embodiments, the buried word line 154 may be formed of Ti, TiN, Ta, TaN, W, WN, TiSiN, WSiN, or a combination thereof. However, embodiments are not limited thereto.

As illustrated in FIG. 18A, the word line structure 150 may be formed to fill the space lines T2 between the plurality of line patterns LP and cover the support structure 142.

Figure 19:
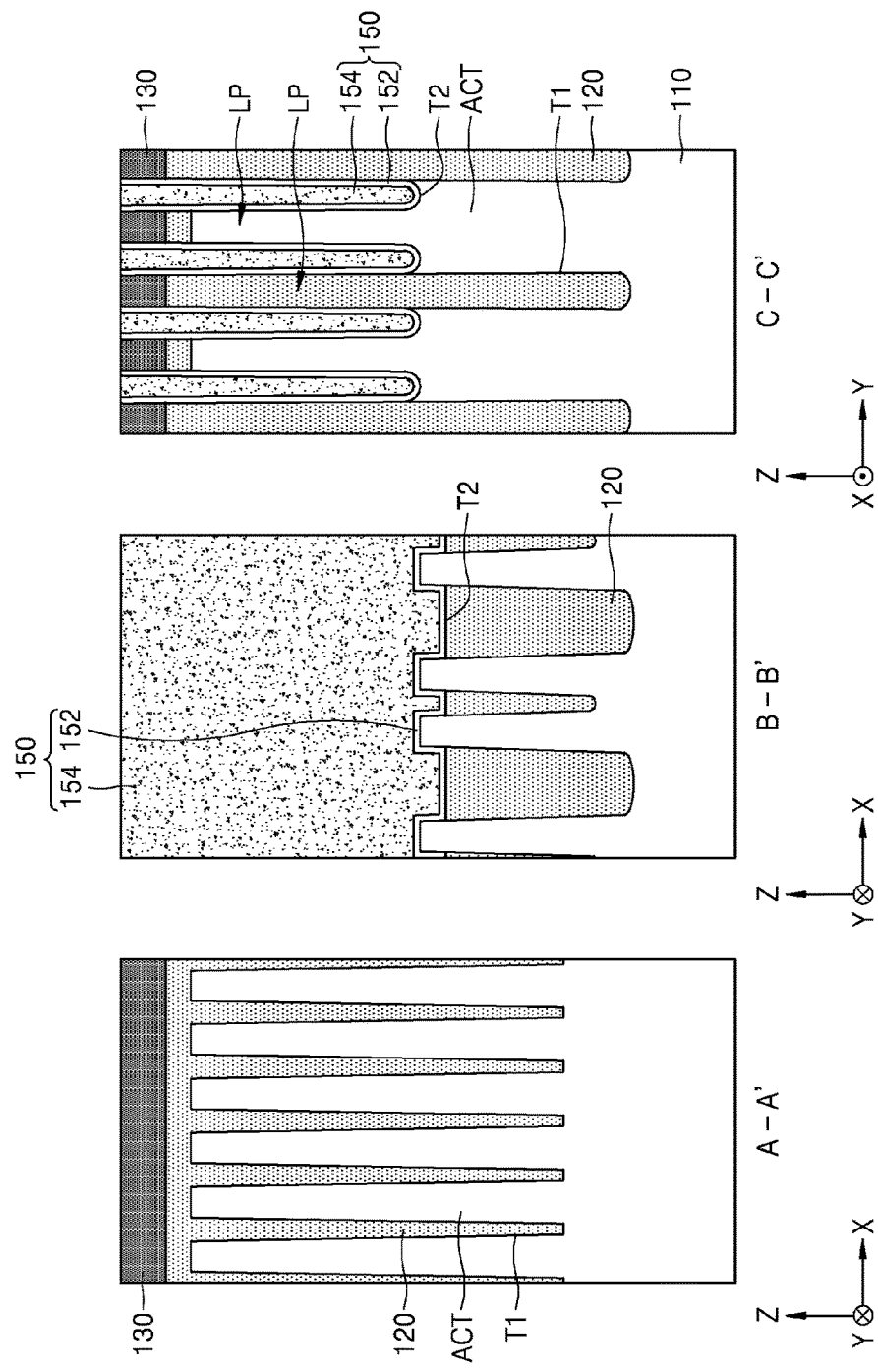

Referring to FIG. 19, the support structure 142 may be removed.

After removing portions of the word line structure 150 that cover the support structure 142 to expose the support structure 142, the support structure 142 may be removed to expose the upper surface of the hard mask pattern 130.

Figure 20:
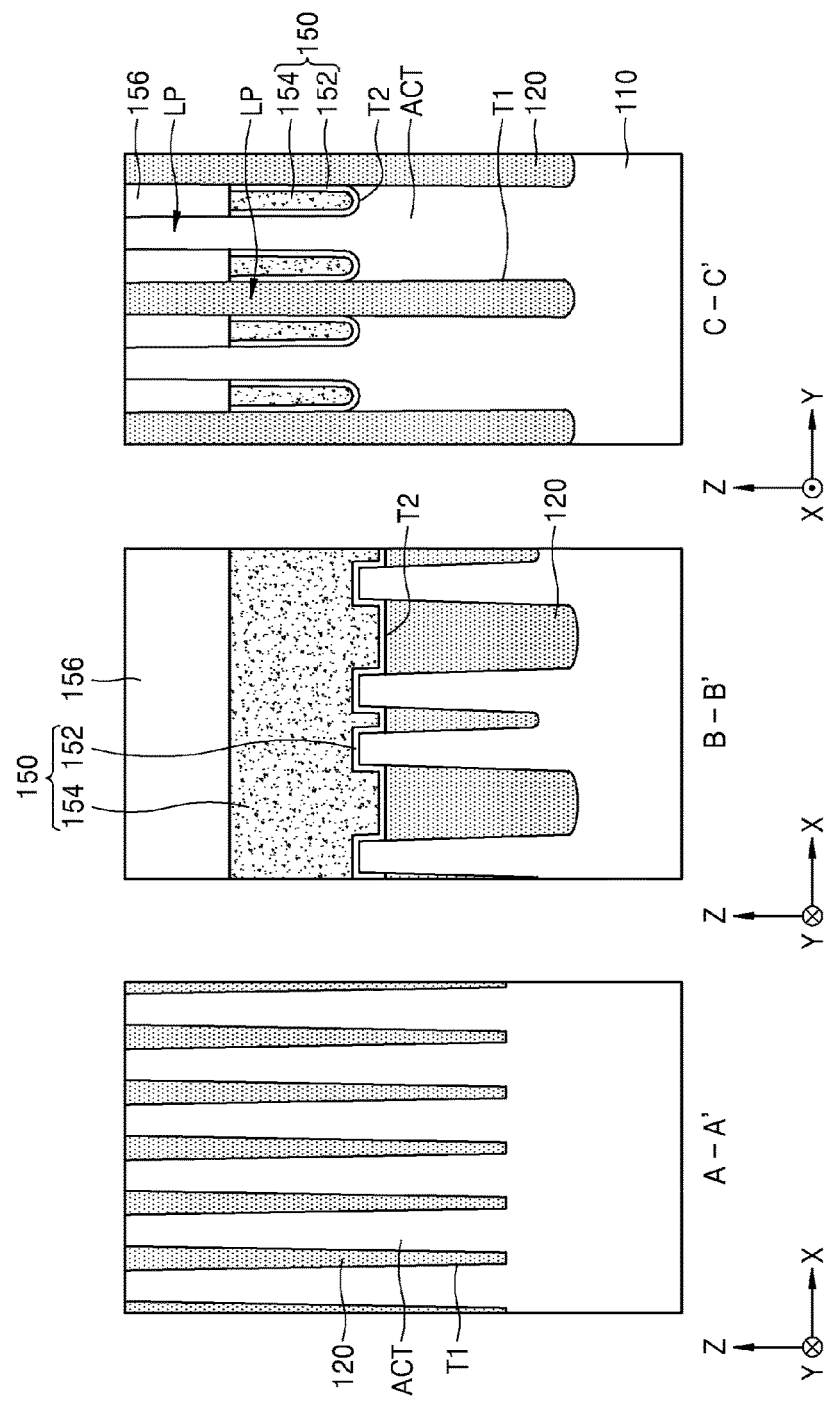

Referring to FIG. 20, after portions of the word line structure 150 are removed by etching the word line structure 150 with the hard mask pattern 130 (see FIG. 19) as an etch mask to expose upper spaces of the plurality of space lines T2, the upper spaces of the plurality of space lines T2 may be filled with a buried insulation layer 156. In some embodiments, the buried insulation layer 156 may be formed of a silicon nitride layer.

Next, a planarization process of removing unnecessary upper portions of the substrate 110 may be performed until the active regions ACT of the substrate are exposed. In some embodiments, the planarization process may be performed using a chemical mechanical polishing (CMP) process.

According to the methods of manufacturing an IC device, according to the embodiments of the inventive concept described above with reference to FIGS. 11A to 20, the word line structure 150 that fills the spaces of the space lines T2 between the plurality of line patterns LP may be formed using the support structure 142 having a simplified structure formed by low-cost and simple processes, while the location and shape of a plurality of line patterns LP having a comparatively high aspect ratio remain fixed. Even when the word line structure 150 is formed by filling the space lines T2 between the plurality of line patterns LP with a material layer having a comparatively large residual stress, for example, with a metal layer or a metal-containing layer, warpage or collapse of the plurality of line patterns LP may be prevented during a deposition process of forming the word line structure 150 and a pattern failure may be inhibited.

FIGS. 21A to 21D are cross-sectional views illustrating a method of manufacturing an IC device according to exemplary embodiments of the inventive concept, and in particular, FIGS. 21A to 21D are cross-sectional views of regions taken along lines A-A', lines B-B', and lines C-C' described with reference to FIGS. 10A to 20. In FIGS. 21A to 21D, like reference numerals as those of FIGS. 11A to 20 refer to like elements throughout, and thus redundant description thereof will be omitted.

Figure 21A:
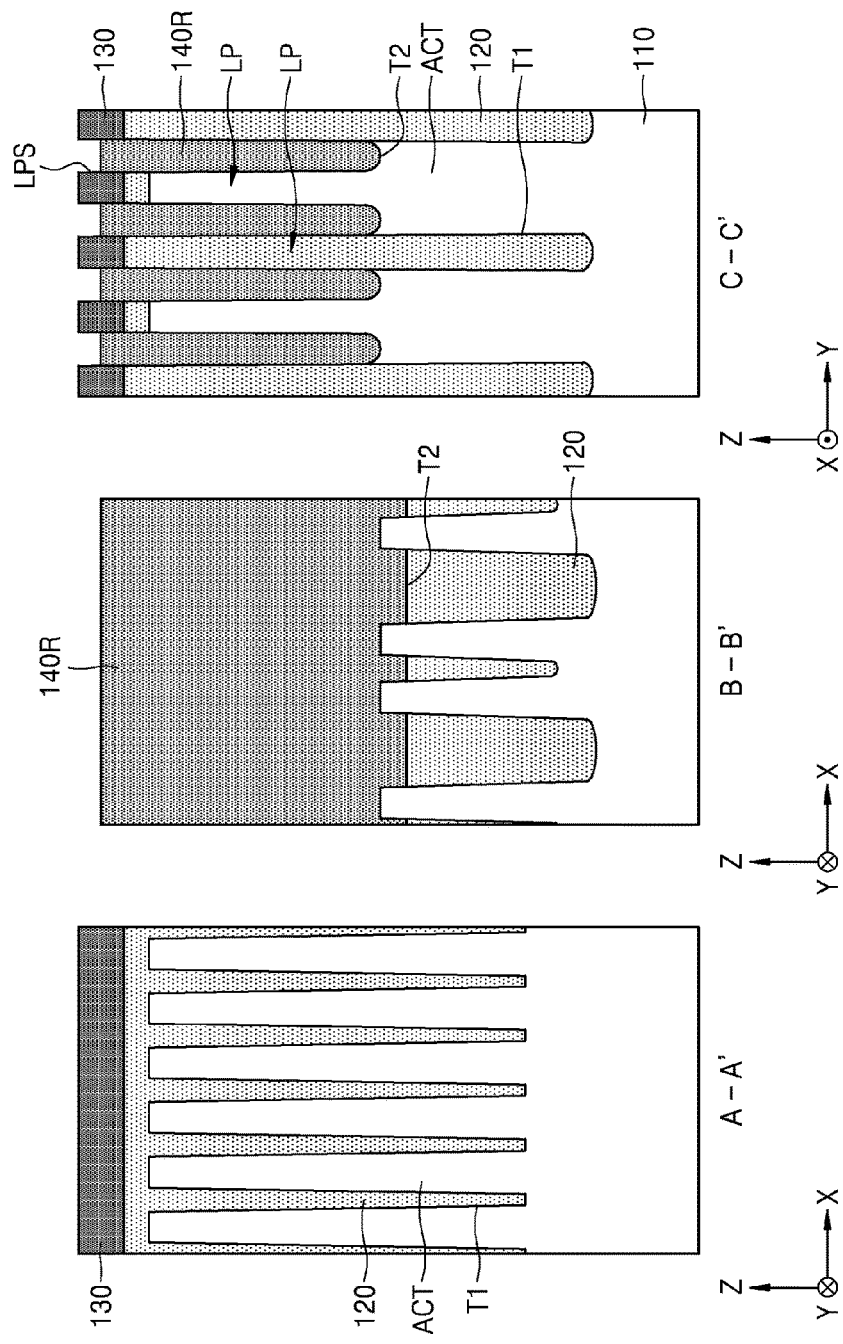
FIGS. 21A to 21D are cross-sectional views illustrating a method of manufacturing an IC device according to exemplary embodiments of the inventive concept.

Referring to FIG. 21A, after the processes of forming the plurality of space lines T2 and forming a plurality of line patterns LP that define the plurality of space lines T2 are formed in the same manner as described above with reference to FIGS. 11A to 14B, a recess sacrificial pattern 140R that fills the space lines T2 between the plurality of line patterns LP may be formed in a similar manner as the method of forming the sacrificial pattern 140 described above with reference to FIGS. 15A and 15B. The recess sacrificial pattern 140R may be formed to have an upper surface that extends at a lower level than the upper surface of the plurality of line patterns LP. The upper surfaces and sidewalls LPS of the plurality of line patterns LP may be exposed after the formation of the recess sacrificial pattern 140R. A detailed structure of the recess sacrificial pattern 140R may be the same as those of the sacrificial pattern 140 described above with reference to FIGS. 15A and 15B.

Figure 21B:
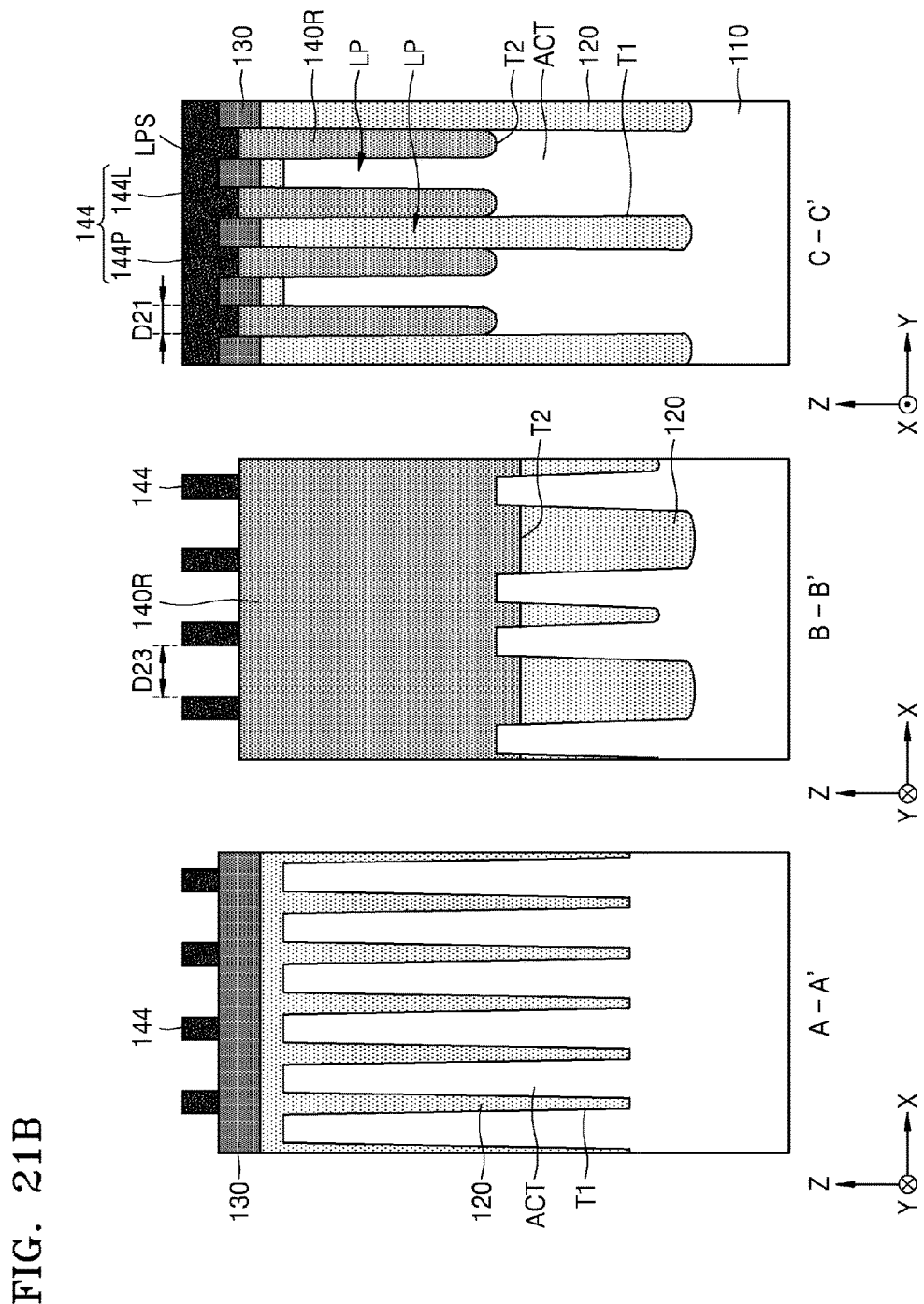

Referring to FIG. 21B, a support structure 144 may be formed on the plurality of line patterns LP and the recess sacrificial pattern 140R to contact the upper surfaces and the side walls LPS of the plurality of line patterns LP and the upper surface of the recess sacrificial pattern 140R in a similar manner as described above with reference to FIGS. 16A and 16B.

To form the support structure 144, after forming a support layer (not shown) that contact the upper surfaces and sidewalls (LPS) of the plurality of line patterns LP and the upper surface of the recess sacrificial pattern 140R, the support layer may be patterned to thereby form the support structure 144.

The support structure 144 may include a linear portion 144L that contacts the upper surfaces of the plurality of line patterns LP and extends on the plurality of line patterns LP and the recess sacrificial pattern 140R in a direction that intersects an extending direction of the plurality of line patterns LP, and a plurality of protruding portions 144P that protrude from the linear portion 144L towards the substrate 110 and contact the sidewalls LPS of the plurality of line patterns LP. A detailed structure of the support structure 144 may be the same as that of the support structure 142 described above with reference to FIGS. 16A and 16B.

A lower surface of the support structure 144 that faces the substrate 110 may include a first local surface that faces the upper surface of the plurality of line patterns LP and a second local surface that faces the upper surface of the recess sacrificial pattern 140R filling the space lines T2. As the upper surface of the recess sacrificial pattern 140R extends at a lower level than the upper surface of the plurality of line patterns LP, the lower surface of the support structure 144 may have a step difference between the first local surface and the second local surface, and may have an uneven shape extending in the Y direction.

A minimum separation distance D23 between the adjacent two of the plurality of support structures may be greater than a separation (e.g., a maximum separation) distance D21 between adjacent two of the plurality of line patterns LP.

Figure 21C:
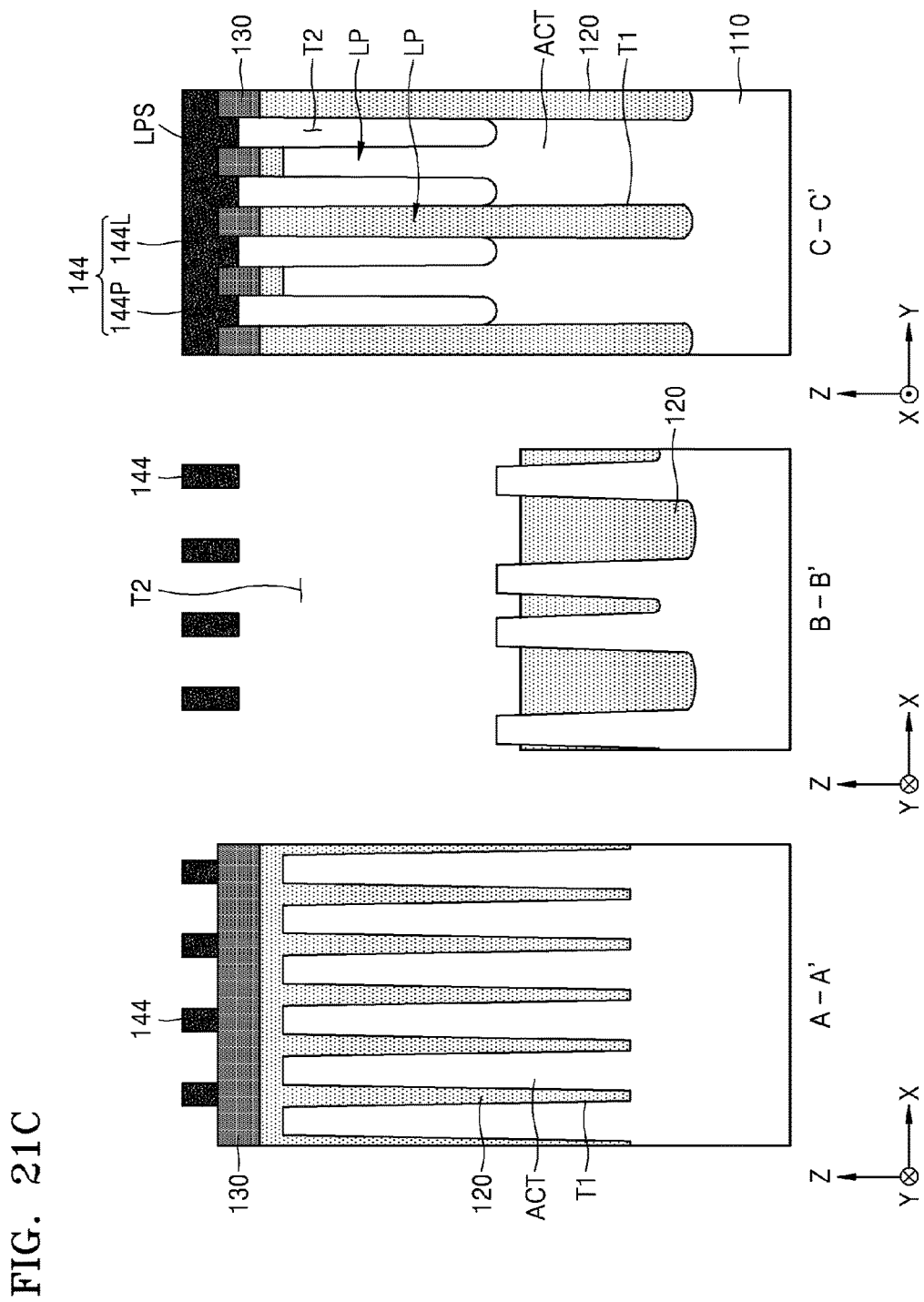

Referring to FIG. 21C, the recess sacrificial pattern 140R (see FIG. 21B) may be removed from the space lines T2 between the plurality of line patterns LP in a similar manner as described above with reference to FIG. 17.

Figure 21D:
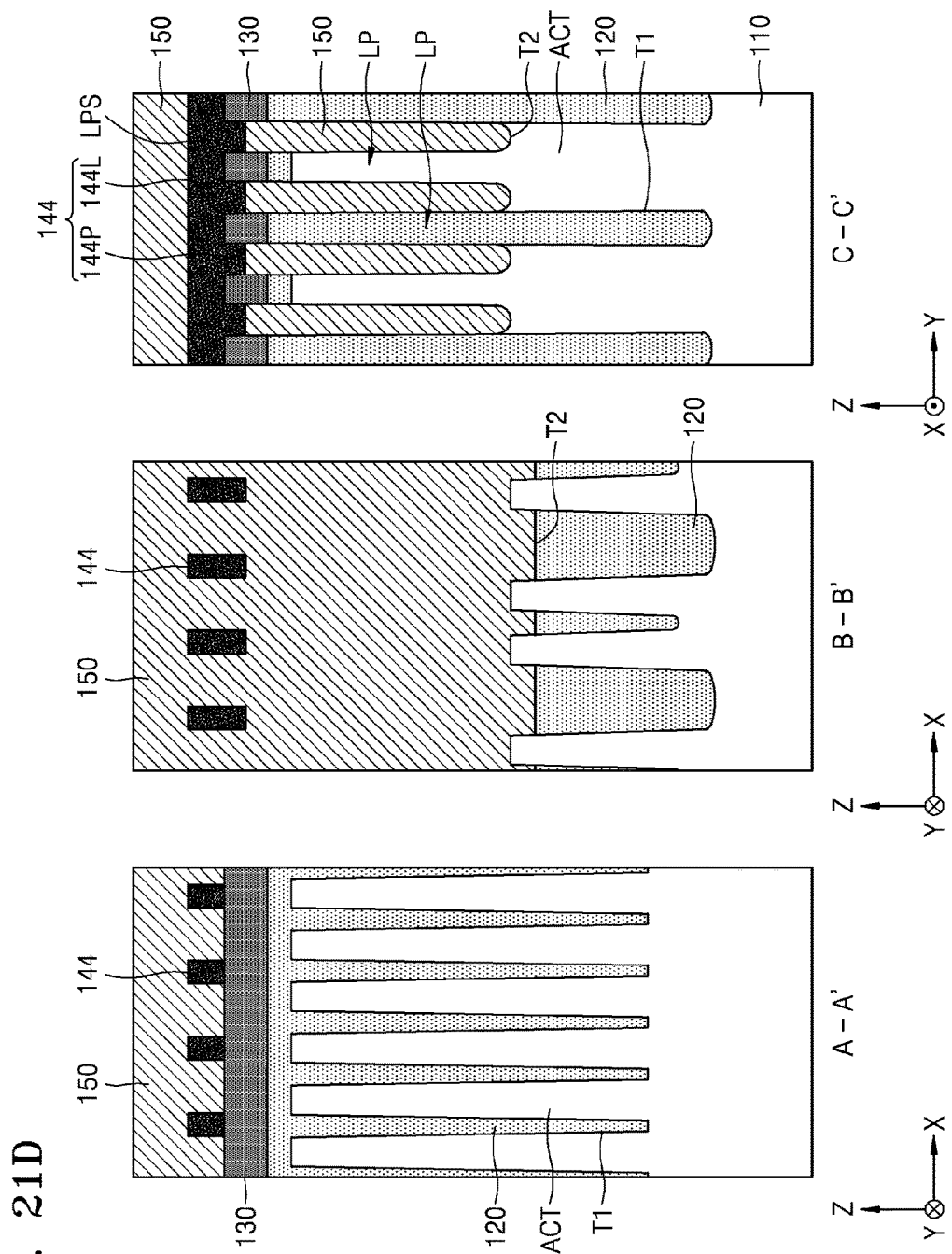

Referring to FIG. 21D, while the support structure 144 contacts the upper surface of the plurality of line patterns LP, a word line structure 150 that fills the space lines T2 between the plurality of line patterns LP may be formed in a similar manner as described above with reference to FIGS. 18A and 18B.

According to the methods of manufacturing an IC device, according to the embodiments of the inventive concept described above with reference to FIGS. 21A to 21D, the word line structure 150 that fills the spaces of the space lines T2 between the plurality of line patterns LP may be formed using the support structure 144 having a simplified structure formed by low-cost and simple processes, while the location and shape of a plurality of line patterns LP having a comparatively high aspect ratio remain fixed. In particular, the plurality of support structures 144 may physically fix the plurality of line patterns LP to the original location thereof during the formation of the word line structure 150 while the plurality of support structures 144 contact the upper surface and sidewalls LPS of the plurality of line patterns LP, so that the binding strength between the plurality of line patterns LP and the plurality of support structures 144 may be further improved, and the plurality of line patterns LP may be more stably supported by the plurality of support structures 144. Thus, even when the word line structure 150 is formed by filling the space lines T2 between the plurality of line patterns LP with a material layer having a comparatively large residual stress, for example, with a metal layer or a metal-containing layer, warpage or collapse of the plurality of line patterns LP may be prevented during a deposition process of forming the word line structure 150, and a pattern failure may be inhibited.

Figure 23A:
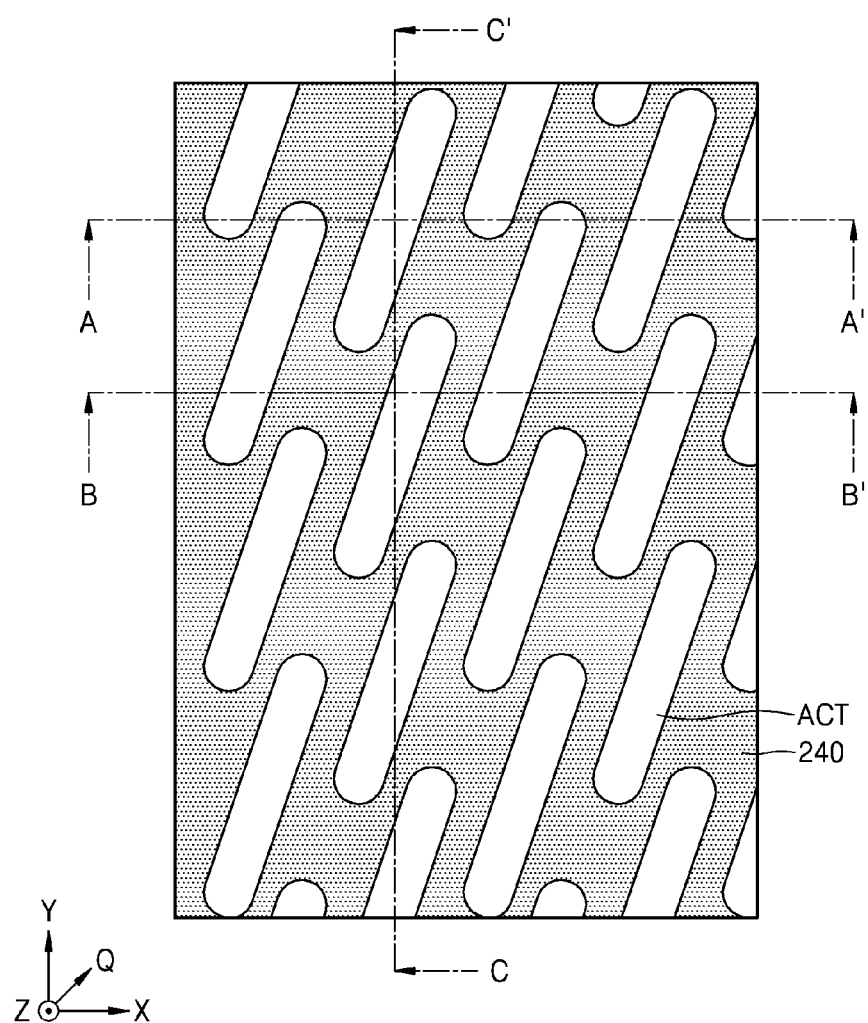
Figure 23B:
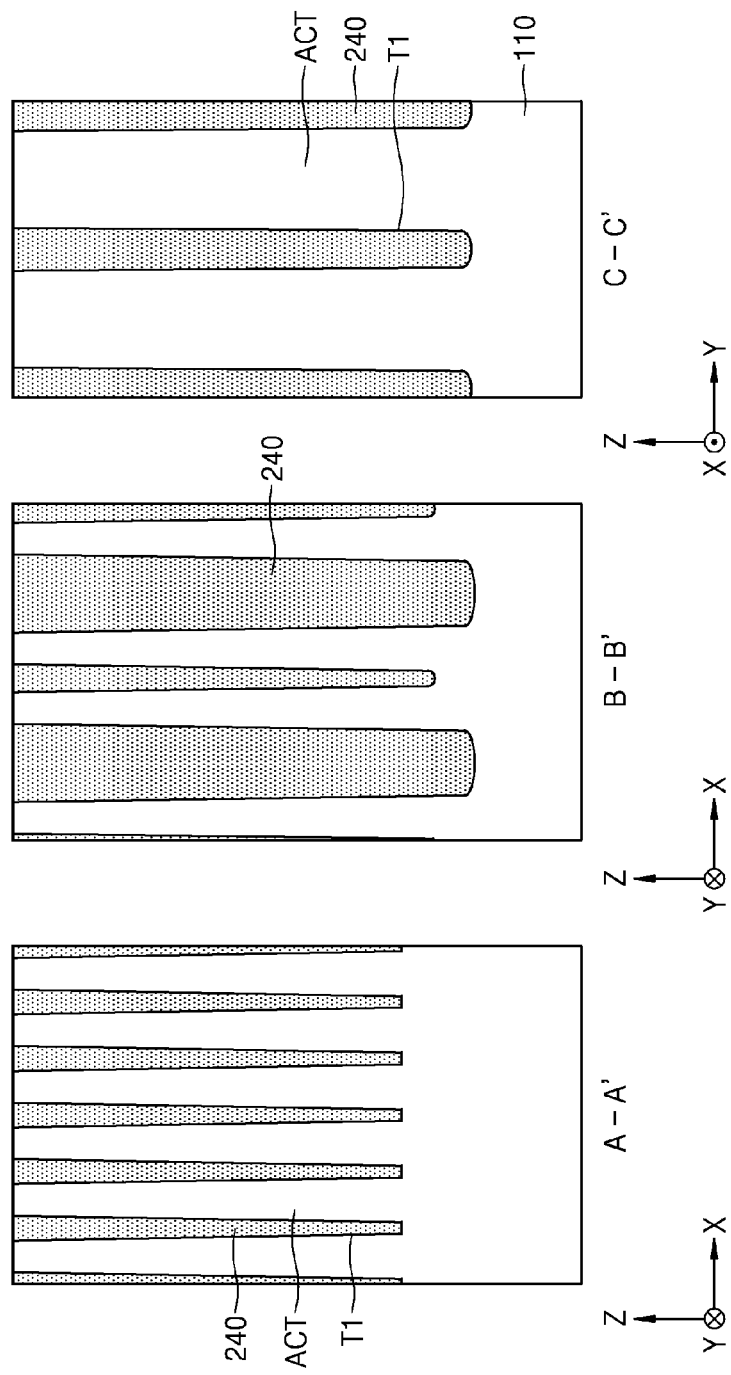
Figure 24A:
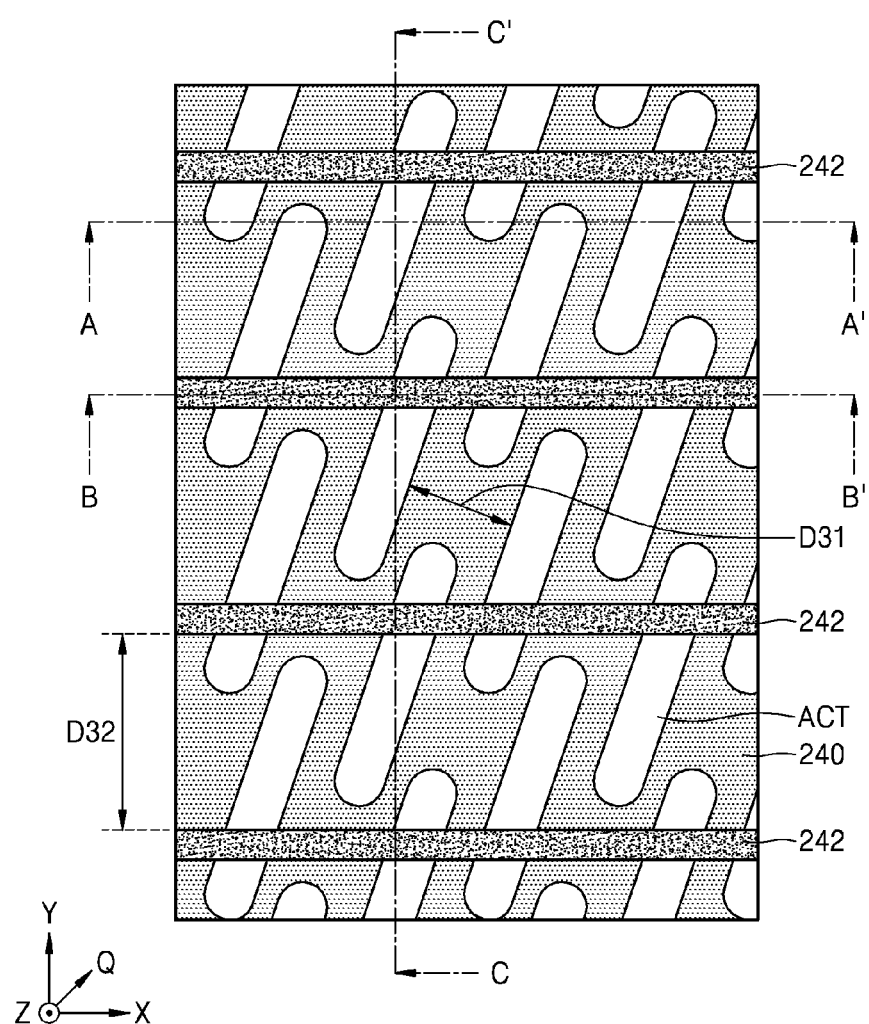
Figure 24B:
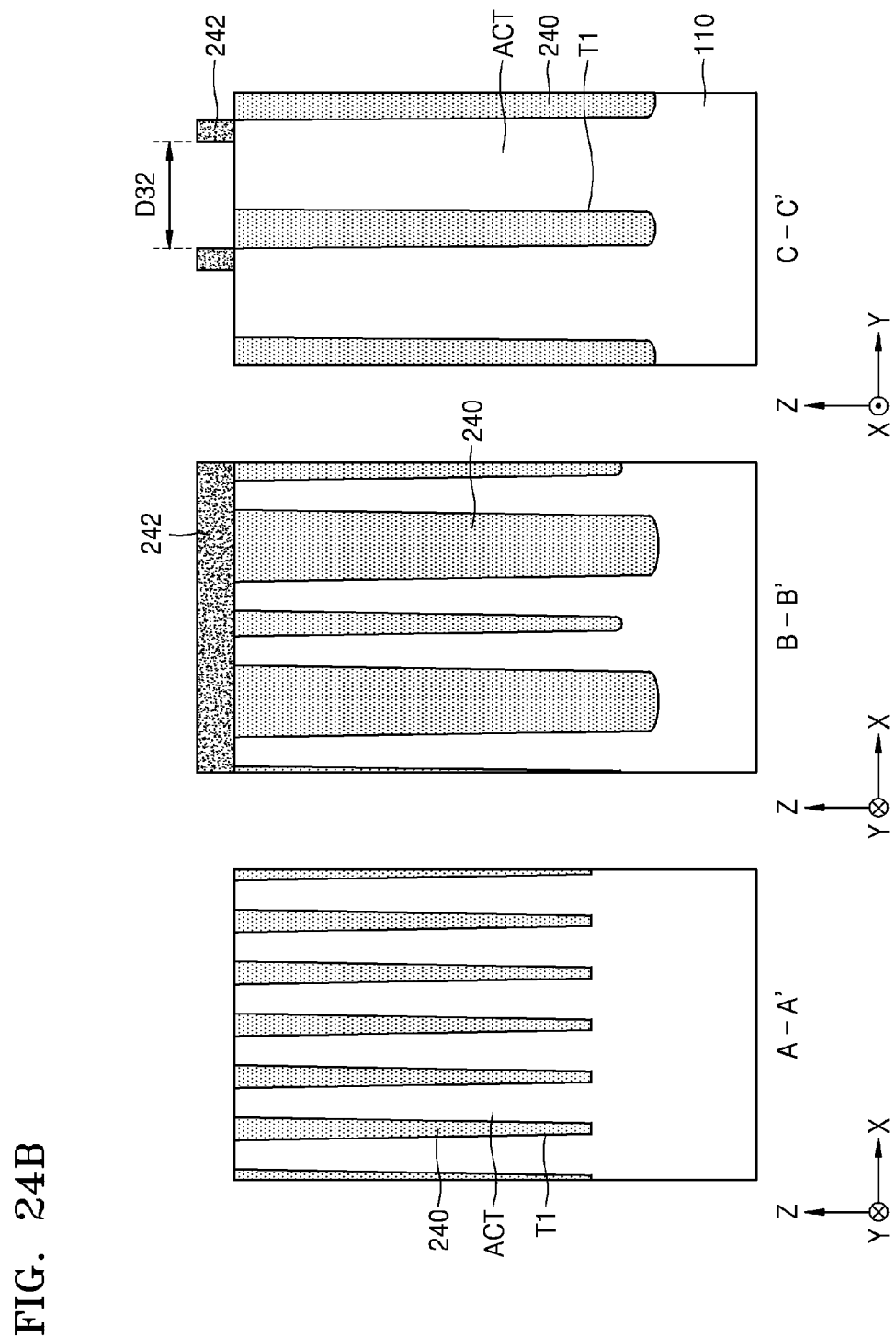
Figure 25A:
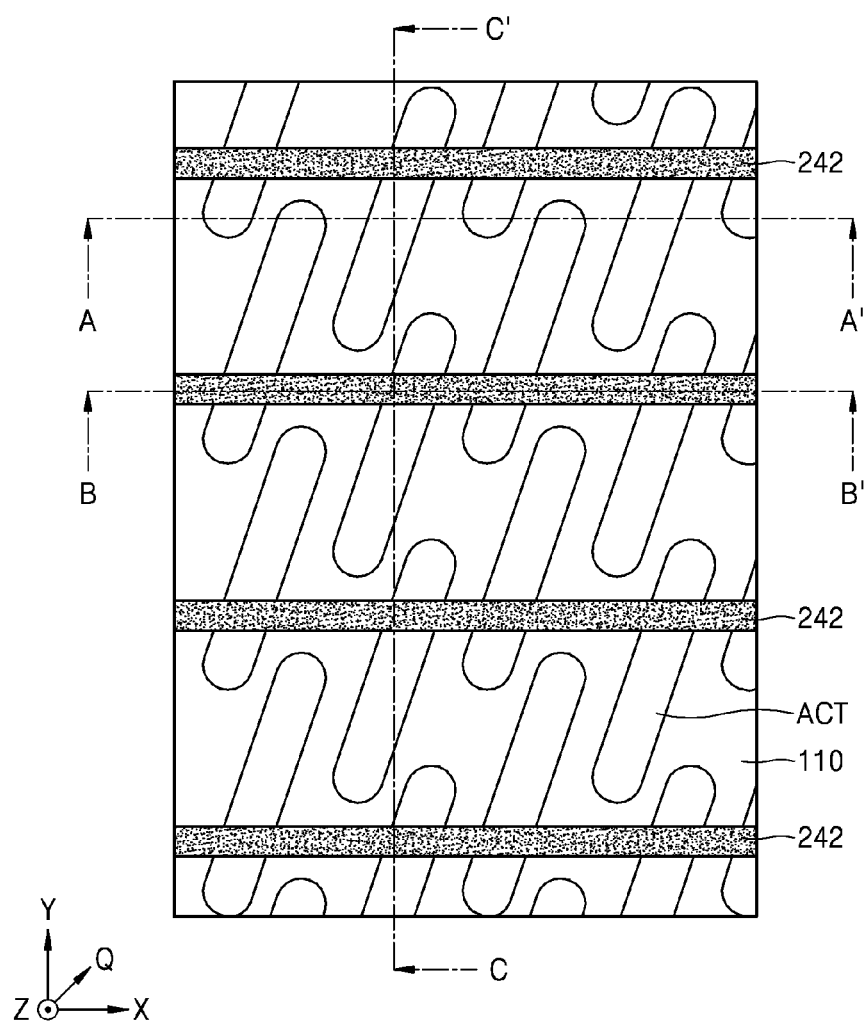
Figure 25B:
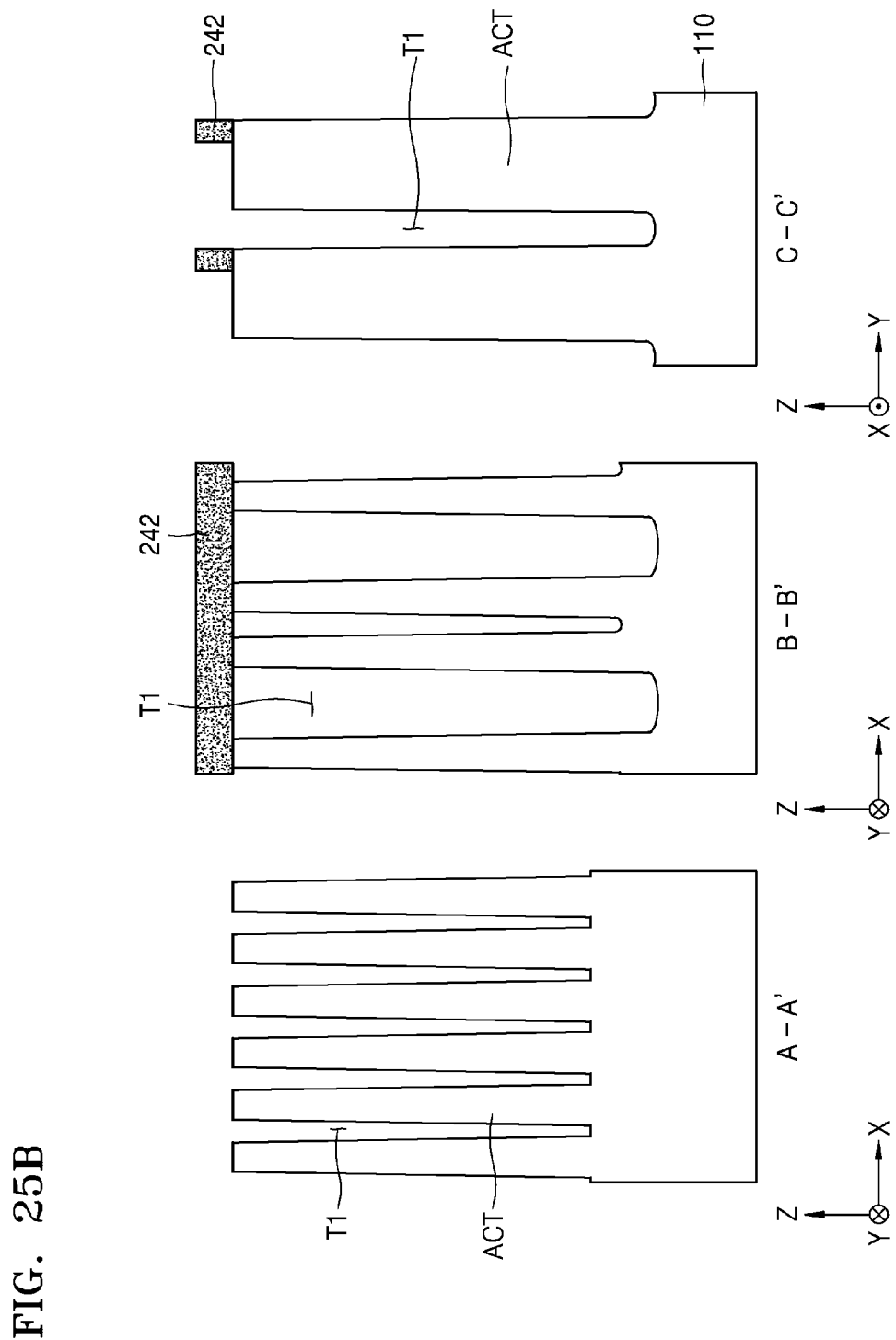
Figure 26:
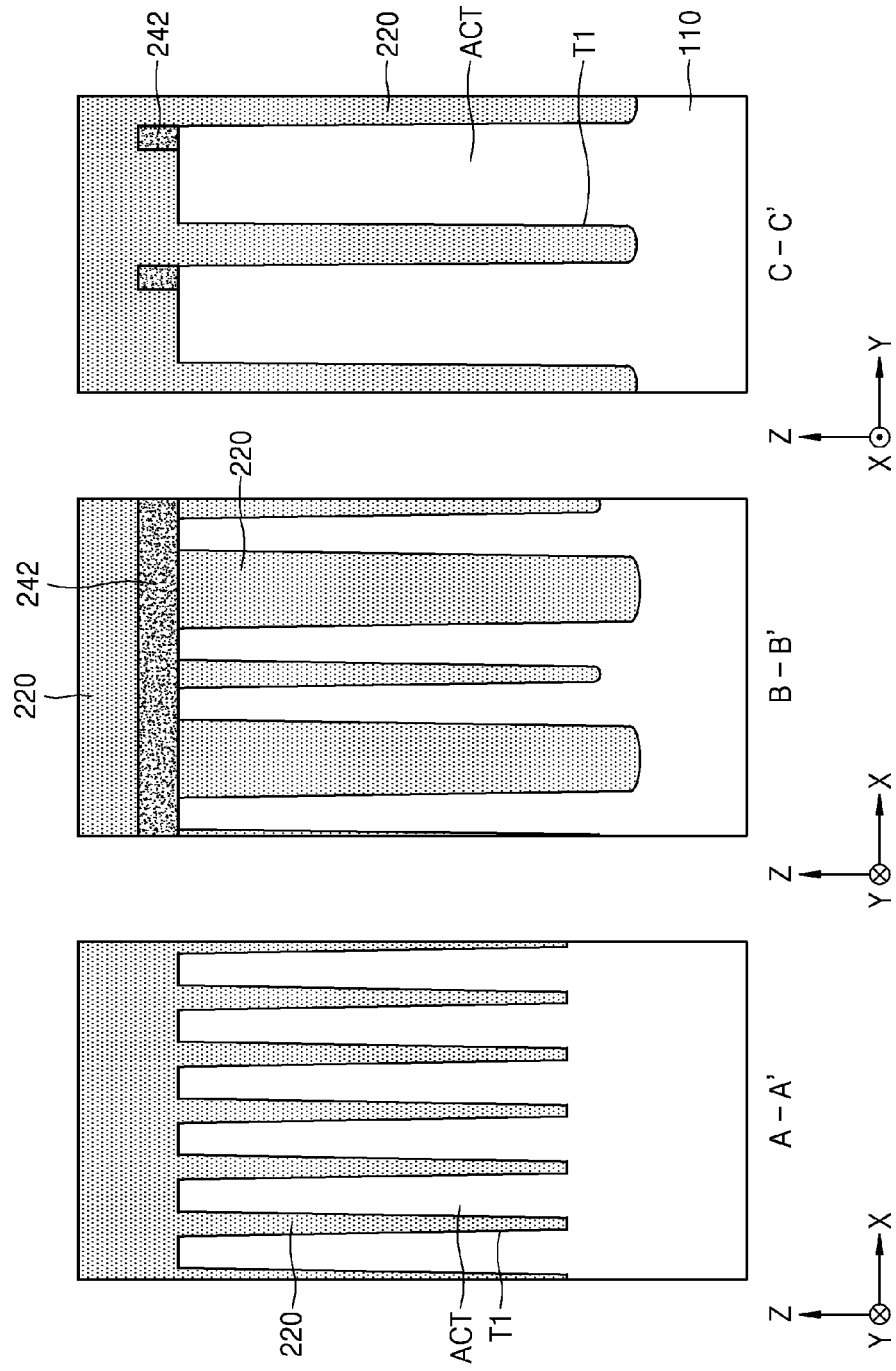
Figure 27:
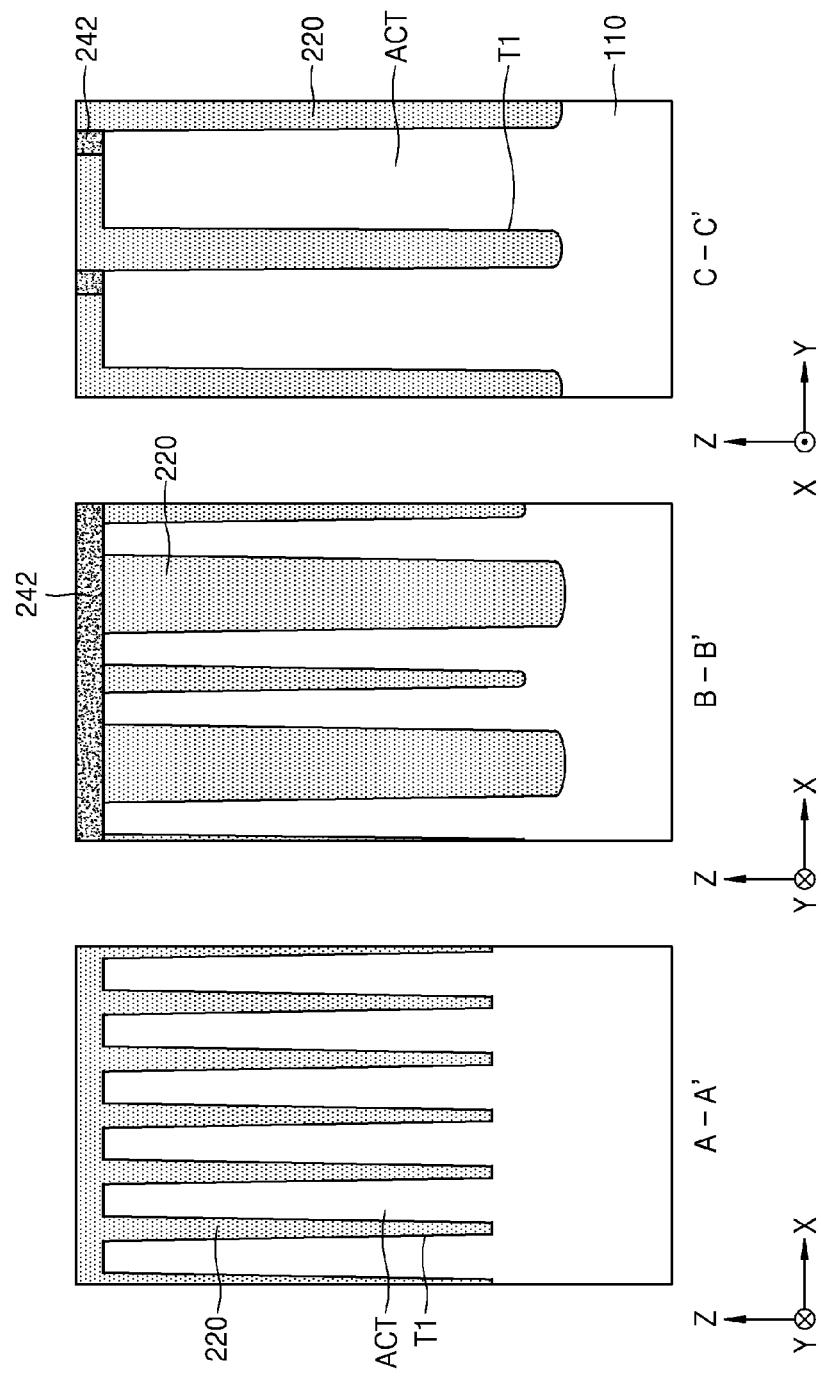
Figure 28:
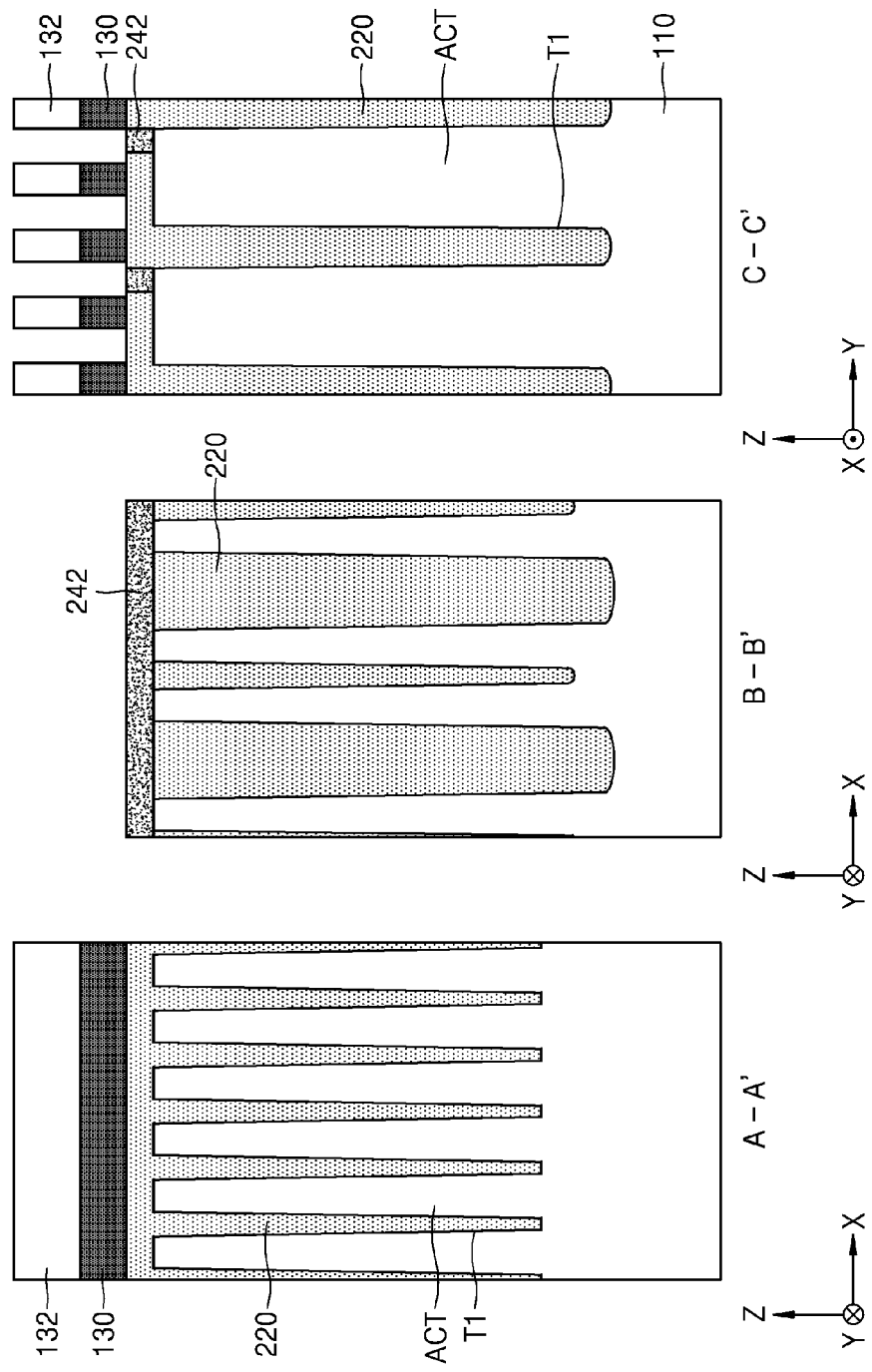

FIGS. 22A to 28 are schematic views for describing a method of manufacturing an IC device according to exemplary embodiments of the inventive concept, and in particular, FIGS. 22A, 23A, 24A, and 25A are plan views for describing sequential processes of manufacturing an IC device according to exemplary embodiments of the inventive concept, FIGS. 22B, 23B, 24B, and 25B are cross-sectional views taken along lines A-A', lines B-B', and lines C-C' of FIGS. 22A, 23A, 24A, and 25A, respectively, and FIGS. 26 to 28 are cross-sectional views illustrating sequential processes after the processes illustrated in FIGS. 25A and 25B, together with the structures of regions taken along line A-A', line B-B', and line C-C' of FIG. 25A. In FIGS. 22A to 28, like reference numerals as those of FIGS. 11A to 20 refer to like elements throughout, and thus redundant description thereof will be omitted.

Figure 22A:
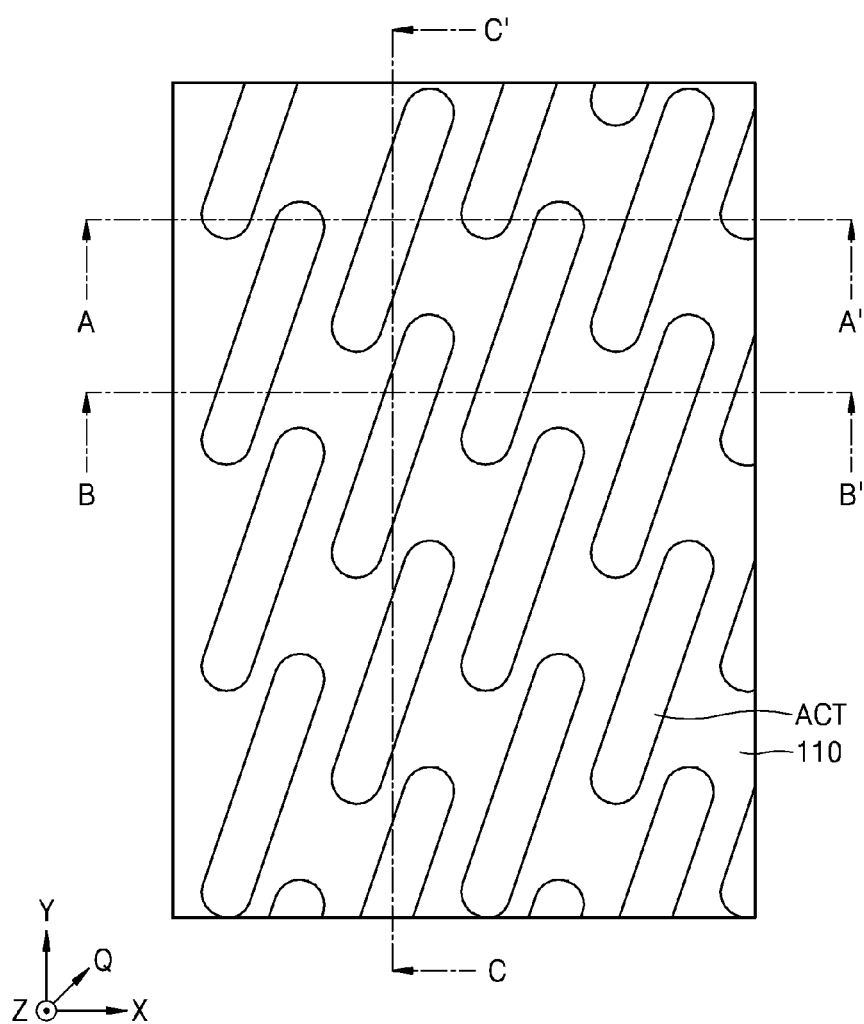
Figure 22B:
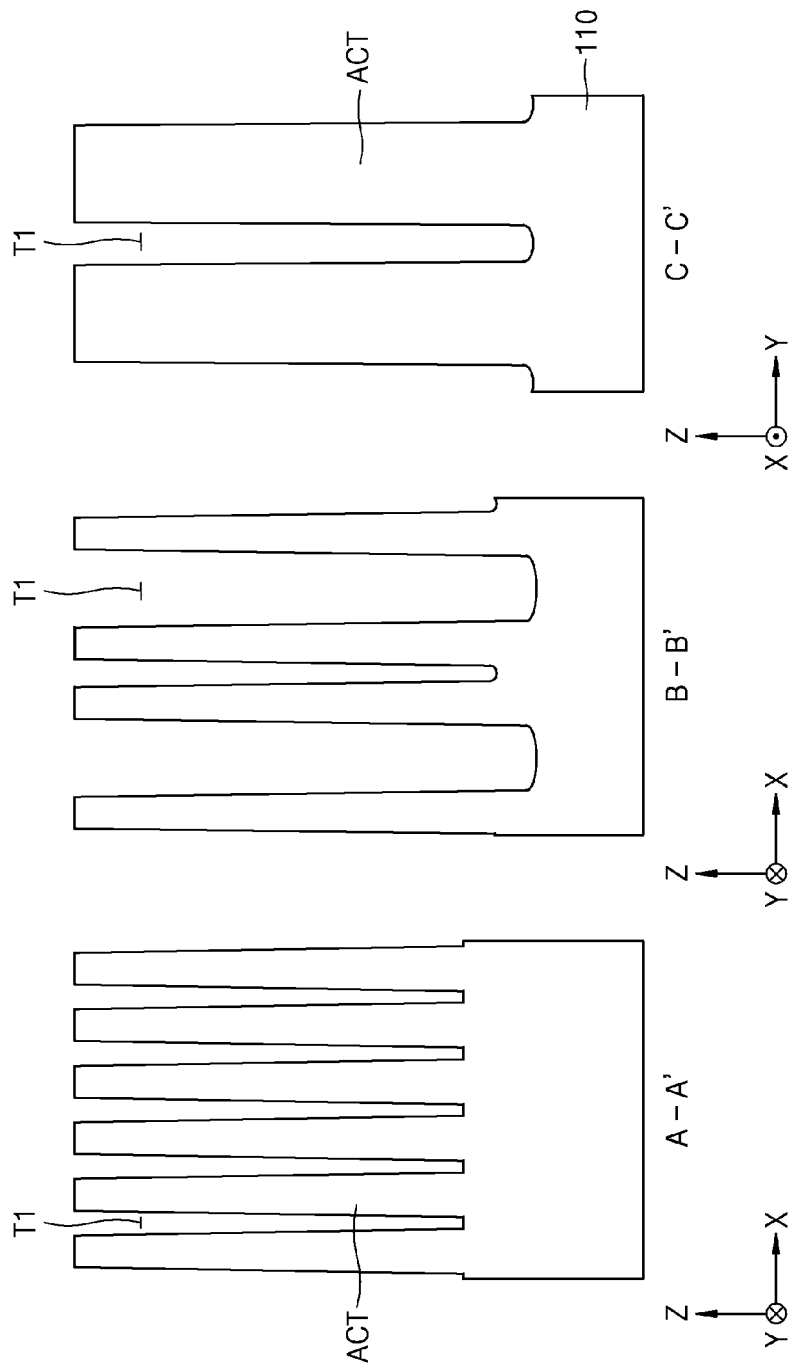
FIGS. 22B, 23B, 24B, and 25B are cross-sectional views taken along lines A-A', lines B-B', and lines C-C' of FIGS. 22A, 23A, 24A, and 25A, respectively.

Referring to FIGS. 22A and 22B, device isolation trenches T1 that define a plurality of active regions ACT extending parallel to one another may be formed by etching the substrate 110.

The plurality of active regions ACT may be formed as a repeating pattern, separated from one another in the X direction and the Y direction. The plurality of active regions ACT may have a shape with a major axis that extends in a diagonal direction (Q direction in FIG. 22A) with respect to the X direction and the Y direction. The plurality of active regions ACT may be as a line pattern with a comparatively high aspect ratio, extending intermittently in the Q direction, and parallel to one another in the X direction and the Y direction.

Referring to FIGS. 23A and 23B, a sacrificial pattern 240 that fills the device isolation trenches T1 may be formed.

The sacrificial pattern 240 may be formed to have an upper surface that extends at the same level as the upper surfaces of the plurality of active regions ACT. The sacrificial pattern 240 may be formed of a different material from the material of the substrate 110. A detailed structure of the sacrificial pattern 240 may be the same as that of the sacrificial pattern 40 described above with reference to FIGS. 3A and 3B.

Referring to FIGS. 24A and 24B, a support structure 242 having a lower surface that contacts the upper surfaces of at least some of the plurality of active regions ACT and the upper surface of the sacrificial pattern 240 may be formed.

The support structure 242 may include a plurality of line patterns that extend on the plurality of active regions ACT, parallel to one another in the X direction and separated from one another.

After forming a support layer (not shown) that contacts the upper surfaces of the plurality of active regions ACT and the upper surface of the sacrificial pattern 240, the support layer may be patterned to form the support structure 242.

The support structure 242 may be formed of a material different from the material of the sacrificial pattern 240. The support structure 242 may be formed of an oxide layer, a nitride layer, or a combination thereof. However, embodiments are not limited thereto.

A lower surface of the support structure 242 that faces the substrate 110 may include a first local surface that faces and contacts the upper surfaces of the plurality of active regions ACT, and a second local surface that faces and contacts the sacrificial pattern 240 filling the device isolation trenches T1. As the upper surface of the sacrificial pattern 240 extends at the same level as the upper surfaces of the plurality of active regions, the lower surface of the support structure 242 may have a planar shape extending in the X direction without a step difference between the first local surface and the second local surface.

A minimum separation distance D32 between adjacent two of the plurality of support structures 242 may be greater than a maximum separation distance D31 among the separation distances between every adjacent two of the plurality of active regions ACT.

Referring to FIGS. 25A and 25B, the sacrificial pattern 240 may be removed from the device isolation trenches T1.

In some embodiments, the sacrificial pattern 240 may be removed using an ashing process and a strip process.

Referring to FIG. 26, while the support structure 242 contacts the upper surfaces of the plurality of active regions ACT, a device isolation layer 220 that fills the device isolation trenches T1 surrounding the plurality of active regions ACT may be formed.

To form the device isolation layer 220, an insulating material may be deposited in the device isolation trenches T1 through the spaces between the plurality of support structures 242. The device isolation layer 220 may be formed to fill the device isolation trenches T1 and cover the plurality of active regions ACT and the support structure 242. The device isolation layer 220 may be formed of a silicon oxide layer, a silicon nitride layer, or a combination thereof.

Referring to FIG. 27, a portion of the device isolation layer 220 may be removed from the upper surface thereof to expose the support structure 242.

The upper surfaces of the plurality of active regions ACT may remain covered with the device isolation layer 220 even after the exposure of the support structure 242.

Referring to FIG. 28, while the upper surfaces of the plurality of active regions ACT are covered with the support structure 242 and the device isolation layer 220, a plurality of mask line patterns 130 and 132 may be formed on the support structure 242 and the device isolation layer 220.

A detailed structure of the plurality of mask line patterns 130 and 132 may be as described above with reference to FIGS. 13A and 13B.

A plurality of space lines T2 that extend parallel to one another in the X direction and a plurality of line patterns LP that define the plurality of space lines T2, as illustrated in FIGS. 14A and 14B, may be formed by etching the support structure 242, the plurality of active regions ACT, and the device isolation layer 220 with the plurality of mask line patterns 130 and 132 as an etch mask. Next, the plurality of space lines T2 may be filled with a gate insulation layer 152, a buried word line 154, and a buried insulation layer 156 by performing the processes described above with reference to FIGS. 15A to 20.

According to the methods of manufacturing an IC device, according to the embodiments of the inventive concept described above with reference to FIGS. 22A to 28, the device isolation layer 200 that fills the spaces of the device isolation trenches T1 surrounding the plurality of active regions ACT may be formed using the support structure 242 having a simplified structure formed by low-cost and simple processes, while the location and shape of the plurality of active regions ACT having a comparatively high aspect ratio remain fixed. Even when the device isolation layer 220 is formed by filling a material layer having a comparative large residual stress in the device isolation trenches T1, warpage or collapse of the plurality of active regions ACT may be prevented during a deposition process of forming the device isolation layer 220, and a pattern failure may be inhibited.

FIGS. 29A to 29E are cross-sectional views illustrating a method of manufacturing an IC device according to exemplary embodiments of the inventive concept. FIGS. 29A to 29E illustrate cross-sectional structures of regions taken along line A-A', line B-B', and line C-C' described with reference to FIGS. 22A to 28. In FIGS. 29A to 29E, like reference numerals as those of FIGS. 11A to 28 refer to like elements throughout, and thus redundant description thereof will be omitted.

Figure 29A:
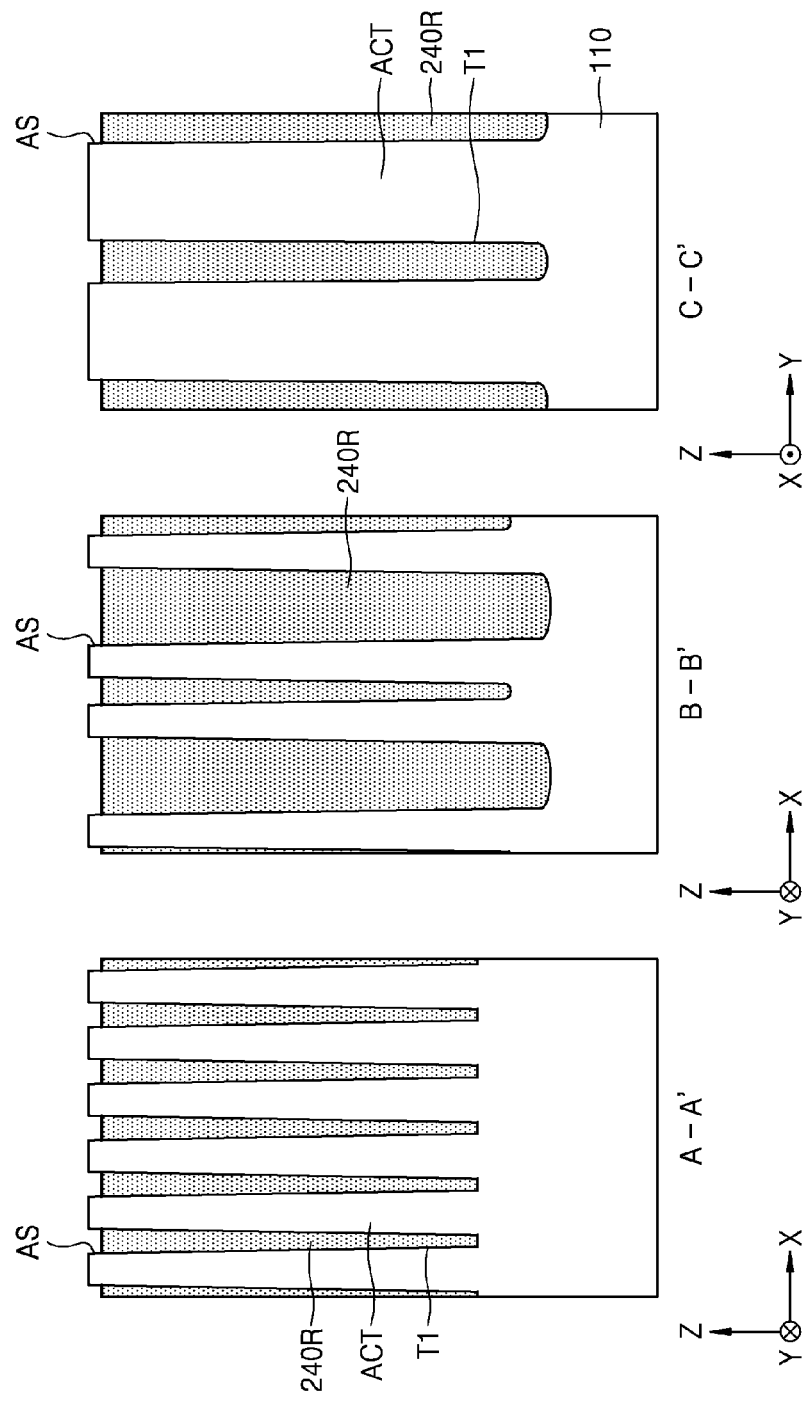
FIGS. 29A to 29E are cross-sectional views illustrating a method of manufacturing an IC device according to exemplary embodiments of the inventive concept.

Referring to FIG. 29A, after forming device isolation trenches T1 that define a plurality of active regions ACT extending parallel to one another by etching the substrate 110 in the same manner as described above with reference to FIGS. 22A and 22B, a recess sacrificial pattern 240R that fills the device isolation trenches T1 may be formed in a similar manner as the method of forming the sacrificial pattern 240 described above with reference to FIGS. 23A and 23B. The recess sacrificial pattern 240R may be formed to have an upper surface that extends at a lower level than the upper surfaces of the plurality of active regions ACT. The upper surface and opposite sidewalls AS of the plurality of active regions ACT may be exposed after the formation of the recess sacrificial pattern 240R. A detailed structure of the recess sacrificial pattern 240R may be the same as that of the sacrificial pattern 240 described above with reference to FIGS. 23A and 23B.

Figure 29B:
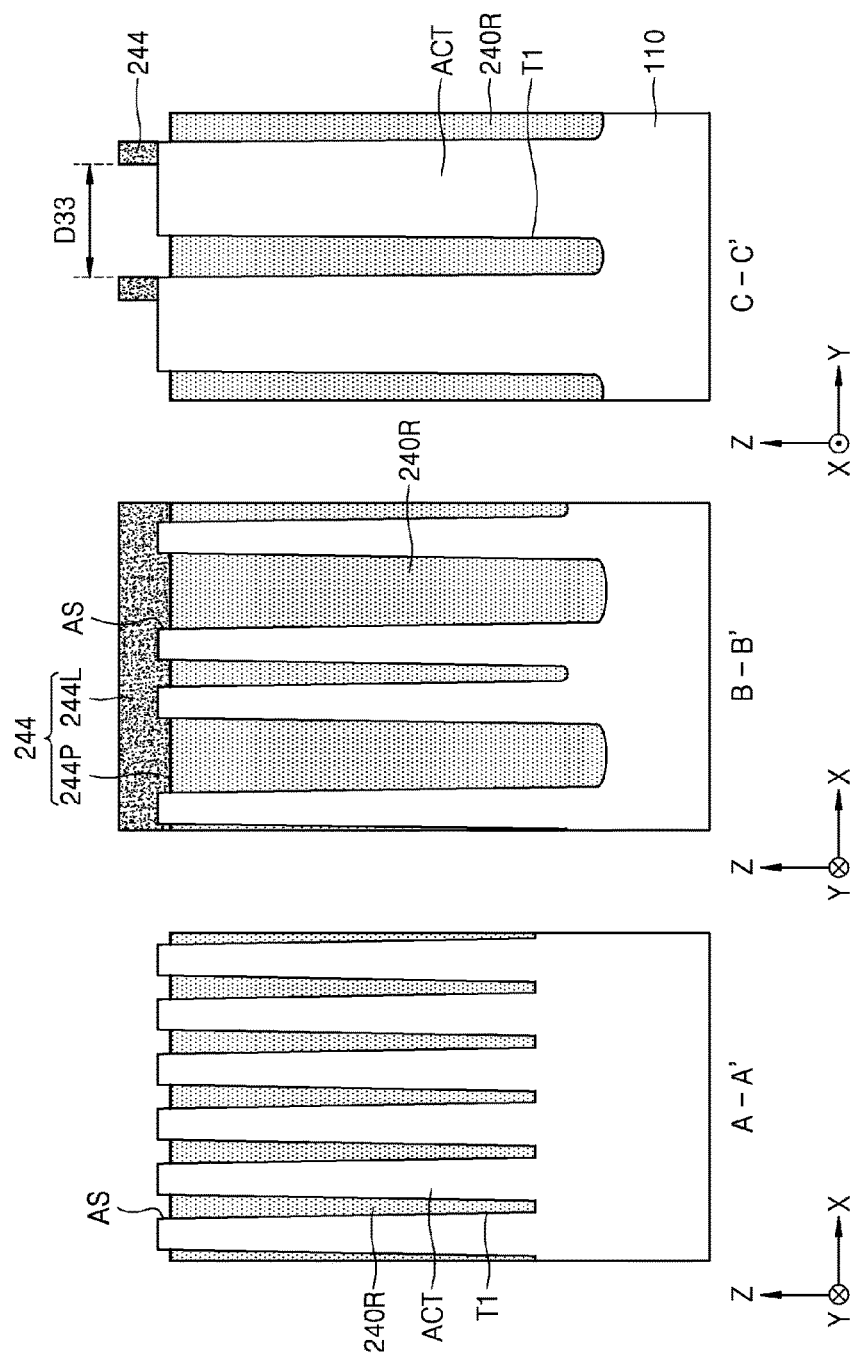

Referring to FIG. 29B, a support structure 244 that contacts the upper surfaces and the opposite sidewalls AS of the plurality of active regions ACT and the upper surface of the recess sacrificial pattern 240R may be formed on the plurality of active regions ACT and the recess sacrificial pattern 240R in a similar manner as described above with reference to FIGS. 24A and 24B.

To form the support structure 244, after forming a support layer (not shown) that contacts the upper surfaces and the sidewalls AS of the plurality of active regions ACT and the upper surface of the recess sacrificial pattern 240R, the support layer may be patterned to thereby form the support structure 244.

The support structure 244 may include a linear portion 244L that contacts the upper surfaces of the plurality of active regions ACT and extends on the plurality of active regions ACT and the recess sacrificial pattern 240R in a direction that intersects an extending direction of the plurality of active regions ACT, and a plurality of protruding portions 244P that protrude from the linear portion 144L toward the substrate 110 and contact the sidewalls AS of the plurality of active regions ACT. A detailed structure of the support structure 244 may be the same as that of the support structure 242 described above with reference to FIGS. 24A and 24B.

A lower surface of the support structure 244 that faces the substrate 110 may include a first local surface that faces the upper surfaces of the plurality of active regions ACT, and a second local surface that faces the recess sacrificial pattern 240R. As the upper surface of the recess sacrificial pattern 240R extends at a lower level than the upper surfaces of the plurality of active regions ACT, the lower surface of the support structure 244 may have a step difference between the first local surface and the second local surface, and may extend with an uneven shape in the X-direction.

A minimum separation distance D33 between adjacent two of the plurality of support structures 244 may be greater than a maximum separation distance D31 (see FIG. 24A)

among the separation distances of adjacent two of the plurality of active regions ACT.

Figure 29C:
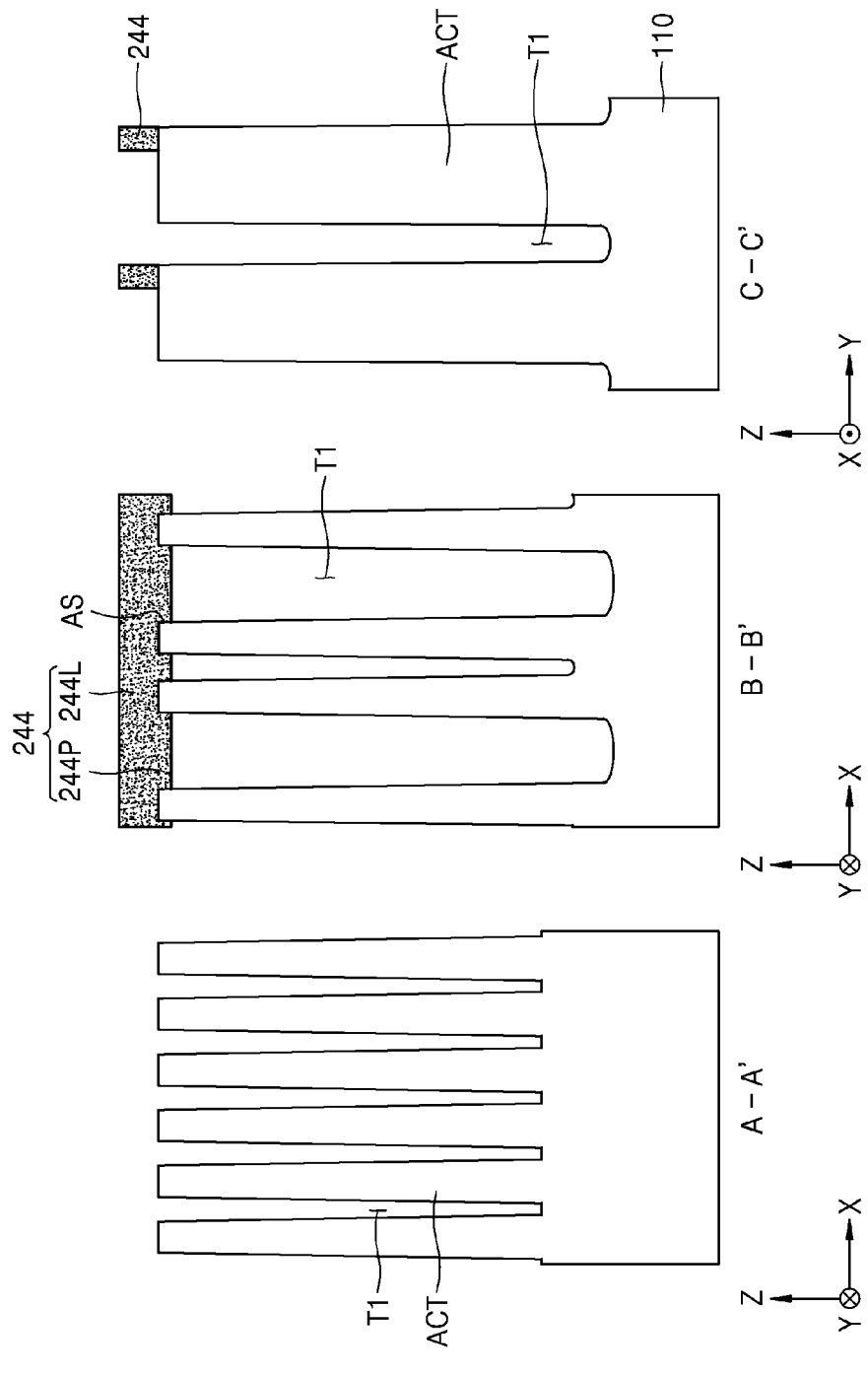

Referring to FIG. 29C, the recess sacrificial pattern 240R may be removed from the device isolation trenches T1 in a similar manner as described above with reference to FIGS. 25A and 25B.

Figure 29D:
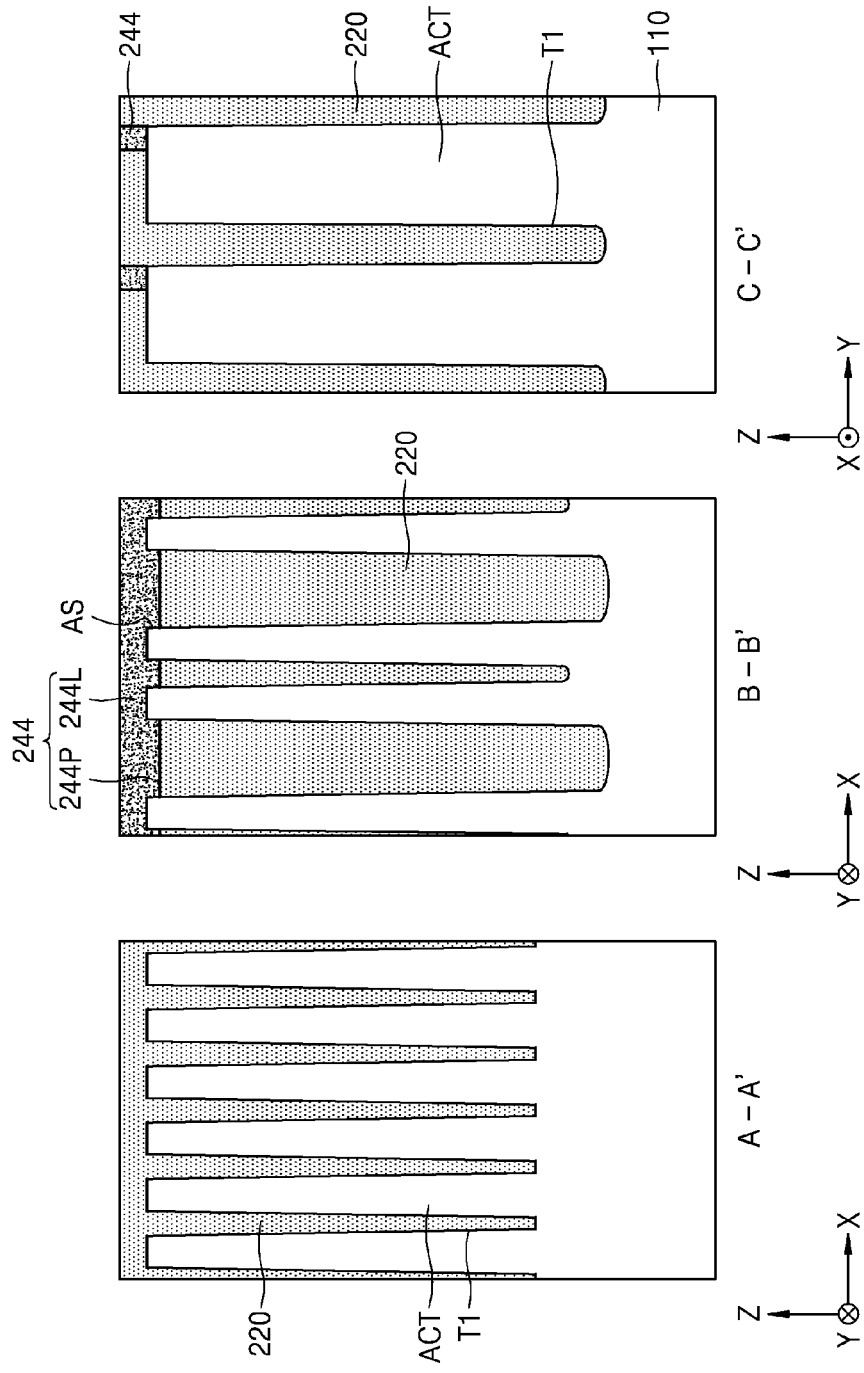

Referring to FIG. 29D, after forming the device isolation layer 220 that fills the device isolation trenches T1 surrounding the plurality of active regions ACT, while the support structure 244 contacts the upper surfaces and the sidewalls AS of the plurality of active regions ACT, in a similar manner as described above with reference to FIG. 26, a portion of the device isolation layer 220 may be removed from the upper surface thereof in a similar manner as described above with reference to FIG. 27, to thereby expose the support structure 244.

Figure 29E:
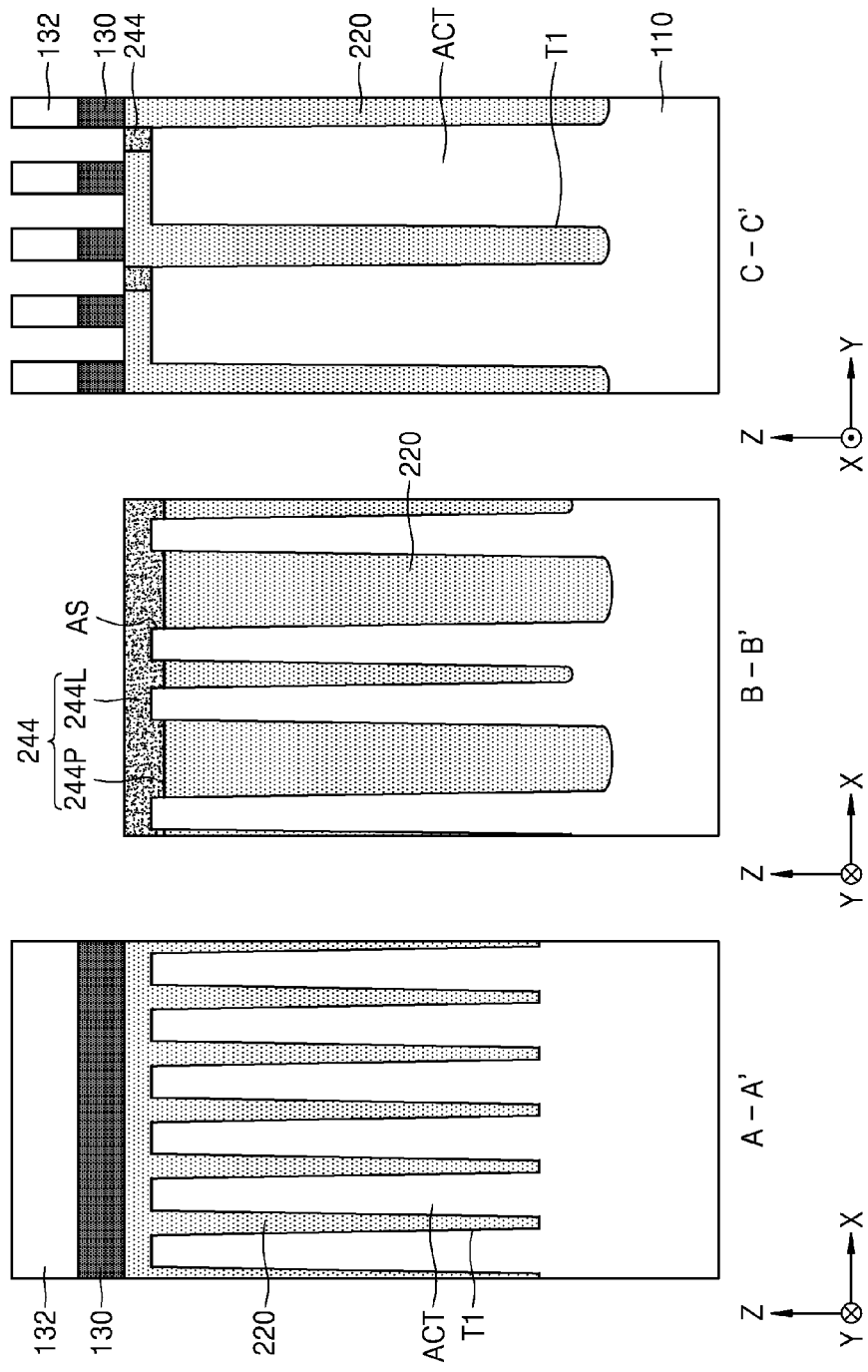

Referring to FIG. 29E, a plurality of mask line patterns 130 and 132 may be formed on the support structure 244 and the device isolation layer 220, while the upper surfaces of the plurality of active regions ACT are covered with the support structure 244 and the device isolation layer 220, in a similar manner as described above with reference to FIG. 28.

A plurality of space lines T2 that extend parallel to one another in the X direction, and a plurality of line patterns LP that define the plurality of space lines T2, as illustrated in FIGS. 14A and 14B, may be formed by etching the support structure 244, the plurality of active regions ACT, and the device isolation layer 120 with the plurality of mask line patterns 130 and 132 as an etch mask. Next, the plurality of space lines T2 may be filled with a gate insulation layer 152, a buried word line 154, and a buried insulation layer 156 by performing the processes as described above with reference to FIGS. 15A to 20.

According to the methods of manufacturing an IC device, according to the embodiments of the inventive concept described above with reference to FIGS. 29A to 29E, the device isolation layer 200 that surrounds the plurality of active regions ACT may be formed using the support structure 244 having a simplified structure formed by low-cost and simple processes, while the location and shape of the plurality of active regions ACT having a comparatively high aspect ratio remain fixed. In particular, the plurality of support structures 244 may physically fix the plurality of active regions ACT to the original location thereof during the formation of the device isolation layer 220 while the plurality of support structures 244 contact the upper surface and sidewalls of the plurality of active regions ACT, so that the binding strength between the plurality of active regions ACT and the plurality of support structures 244 may be further improved, and the plurality of active regions ACT may be more stably supported by the plurality of support structures 244. Thus, even when the device isolation layer 220 is formed by filling the device isolation trenches T1 surrounding the plurality of active regions ACT with a material layer having a comparatively large residual stress, warpage or collapse of the plurality of active regions ACT may be prevented during a deposition process of forming the device isolation layer 220, and a pattern failure may be inhibited.

As described above, according to the one or more embodiments, a method of manufacturing an IC device may include: forming a device isolation trench in a substrate, the device isolation trench defining a plurality of active regions; forming a device isolation layer that fills the device isolation trench around the plurality of active regions; forming a plurality of mask line patterns on the plurality of active regions and the device isolation layer, the plurality of mask line patterns extending parallel to one another in a first direction and being separated from one another; forming a plurality of space lines and a plurality of line patterns that define the plurality of space lines by etching the plurality of active regions and the device isolation layer with the plurality of mask line patterns as an etch mask; forming at least one support structure that contacts an upper surface of the plurality of mask line patterns and extends on the plurality of mask line patterns in a second direction that intersects the first direction; and forming a word line structure that fills the plurality of space lines while the at least one support structure contacts the upper surface of the plurality of mask line patterns.

As described above, according to the one or more embodiments, a method of manufacturing an IC device may include: forming a device isolation trench that defines a plurality of active regions extending parallel to one another in a first direction, by etching a substrate; forming at least one support structure that contacts an upper surface of the plurality of active regions and extends on the plurality of active regions in a second direction that intersects the first direction; and forming a device isolation layer that fills the device isolation trench while the at least one support structure contacts the upper surface of the plurality of active regions.

As described above, according to the one or more embodiments, a method of manufacturing an IC device with a line-and-space pattern as a repeating arrangement of line patterns may prevent warpage or collapse of a plurality of line patterns in the IC device and inhibit a pattern failure, and thus improving a manufacturing yield and ensuring improved reliability of an IC device.

While the inventive concept has been particularly shown and described with reference to exemplary embodiments thereof, it will be understood that various changes in form and details may be made therein without departing from the spirit and scope of the following claims.

What is claimed is:

1. A method of manufacturing an integrated circuit device, the method comprising:
providing a substrate with a pattern structure, the pattern structure comprising a plurality of first patterns that extend in a first direction, are parallel to one another, and are separated from one another with a space therebetween;
forming at least one support structure that contacts an upper surface of the pattern structure and extends on the pattern structure in a second direction that crosses the first direction;
forming, while the at least one support structure contacts the upper surface of the pattern structure, a buried layer that fills the spaces between the plurality of first patterns; and
removing the at least one support structure from the pattern structure,
wherein in the forming of the at least one support structure, a lower surface of the at least one support structure that faces the substrate includes a first local surface and a second local surface without a step difference between the first local surface and the second local surface, the first local surface facing the upper surface of the pattern structure, the second local surface facing the space, the lower surface having a planar shape that extends in the second direction.

2. The method of claim 1, wherein the forming of the at least one support structure comprises:

forming a sacrificial pattern on the substrate, the sacrificial pattern filling the spaces in the plurality of first patterns;

forming a support layer on the pattern structure and the sacrificial pattern, the support layer contacting the upper surface of the pattern structure and an upper surface of the sacrificial pattern; and forming the at least one support structure by patterning the support layer.

3. The method of claim 2, wherein the forming of the sacrificial pattern comprises:

forming a sacrificial layer that fills the spaces between the plurality of first patterns and covers the upper surface of the pattern structure; and exposing the upper surface of the pattern structure by removing a portion of the sacrificial layer so that the sacrificial layer remains only in the spaces between the plurality of first patterns.

4. The method of claim 2, wherein, in the forming of the sacrificial pattern, the sacrificial pattern is formed in a manner such that an upper surface of the sacrificial pattern is disposed at a same level as the upper surface of the pattern structure.

5. The method of claim 2, wherein, in the forming of the sacrificial pattern, the sacrificial pattern is formed to have an upper surface that is disposed at a lower level than the upper surface of the pattern structure.

6. The method of claim 1, wherein in the forming of the at least one support structure, a plurality of support structures are formed separated from one another, a minimum separation distance between adjacent two of the plurality of support structures being greater than a maximum separation distance between adjacent two of the plurality of first patterns in the second direction.

7. The method of claim 1, wherein the forming of the pattern structure comprises forming the plurality of first patterns by etching the substrate.

8. The method of claim 1, wherein the forming of the pattern structure comprises:

forming a plurality of second patterns on the substrate, the plurality of second patterns including a different material from a material of the substrate; and forming the plurality of first patterns by etching the substrate with the plurality of second patterns as an etch mask, and the at least one support structure is formed to contact an upper surface of the plurality of second patterns.

9. A method of manufacturing an integrated circuit device, the method comprising:

forming a device isolation trench in a substrate, the device isolation trench defining a plurality of active regions;

forming a device isolation layer that fills the device isolation trench around the plurality of active regions;

forming a plurality of mask line patterns on the plurality of active regions and the device isolation layer, the plurality of mask line patterns extending parallel to one another in a first direction and being separated from one another by a predefined distance;

forming a plurality of space lines and a plurality of line patterns that define the plurality of space lines by etching the plurality of active regions and the device isolation layer with the plurality of mask line patterns as an etch mask;

forming at least one support structure that contacts an upper surface of the plurality of mask line patterns and extends on the plurality of mask line patterns in a second direction that intersects the first direction; and forming a word line structure that fills the plurality of space lines while the at least one support structure contacts the upper surface of the plurality of mask line patterns.

10. The method of claim 9, wherein, in the forming of the at least one support structure, a plurality of support structures are formed separated from one another by the predefined distance, wherein a minimum separation distance between adjacent two of the plurality of support structures being greater than a maximum separation distance between adjacent two of the plurality of mask line patterns in the second direction.

11. The method of claim 9, wherein the plurality of line patterns comprises some of the plurality of active regions and a portion of the device isolation layer.

12. The method of claim 9, wherein the word line structure comprises metal.

13. The method of claim 9, further comprising removing the at least one support structure and the plurality of mask line patterns.

14. The method of claim 9, wherein the forming of the at least one support structure comprises:

forming a sacrificial pattern that fills the plurality of space lines;

forming the at least one support structure having a lower surface that contacts an upper surface of at least portion of the plurality of mask line patterns and an upper surface of the sacrificial pattern; and removing the sacrificial pattern.

15. The method of claim 14, wherein, in the forming of the at least one support structure, the lower surface of the at least one support structure is a planar surface.

16. The method of claim 14, wherein, in the forming of the at least one support structure, the at least one support structure is formed to contact a portion of the upper surface and sidewalls of the plurality of mask line patterns.

17. The method of claim 14, wherein, in the removing of the sacrificial pattern, the sacrificial pattern is removed using an ashing process and a strip process.

18. A method of manufacturing an integrated circuit device, the method comprising:

providing a substrate with a pattern structure, the pattern structure comprising a plurality of first patterns that extend in a first direction, are parallel to one another, and are separated from one another with a space therebetween;

forming a sacrificial pattern on the substrate, the sacrificial pattern filling the spaces between the plurality of first patterns and formed of a different material from a material of the pattern structure;

forming at least one support structure on upper surfaces of the pattern structure and extending on the pattern structure and the sacrificial pattern in a second direction that crosses the first direction, wherein the at least one support structure is formed of a different material from a material of the sacrificial pattern;

removing the sacrificial pattern from the spaces in the plurality first patterns;

forming, while the at least one support structure contacts the upper surface of the pattern structure, a buried layer that fills the spaces between the plurality of first patterns; and removing the at least one support structure from the pattern structure so that only the buried layer remains in the spaces between the plurality of first patterns, wherein in the forming of the at least one support structure, a lower surface of the at least one support structure that faces the substrate includes a first local surface and a second local surface without a step difference between the first local surface and the second local surface, the first local surface facing the upper surface of the pattern structure, the second local surface facing the space, the lower surface having a planar shape that extends in the second direction.

19. The method of claim 18, wherein in the forming of the at least one support structure, a plurality of support structures are formed separated from one another, a minimum separation distance between adjacent two of the plurality of support structures being greater than a maximum separation distance between adjacent two of the plurality of first patterns in the second direction.

20. The method of claim 18, wherein, in the removing of the sacrificial pattern, the sacrificial pattern is removed using an ashing process and a strip process.

\* \* \* \* \*